United States Patent
Igarashi et al.

(10) Patent No.: US 7,740,956 B2
(45) Date of Patent: Jun. 22, 2010

(54) ORGANIC ELECTROLUMINESCENT DEVICE

(75) Inventors: Tatsuya Igarashi, Minami-Ashigara (JP); Saisuke Watanabe, Minami-Ashigara (JP); Toshihiro Ise, Minami-Ashigara (JP); Hisashi Okada, Minami-Ashigara (JP); Kazumi Nii, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 983 days.

(21) Appl. No.: 10/530,289

(22) PCT Filed: Dec. 26, 2003

(86) PCT No.: PCT/JP03/17048

§ 371 (c)(1),
(2), (4) Date: Apr. 5, 2005

(87) PCT Pub. No.: WO2004/062324

PCT Pub. Date: Jul. 22, 2004

(65) Prior Publication Data

US 2006/0083944 A1    Apr. 20, 2006

(30) Foreign Application Priority Data

Dec. 27, 2002 (JP) ............................ 2002-381014
Dec. 8, 2003 (JP) ............................ 2003-409183

(51) Int. Cl.
*H01L 51/54* (2006.01)
(52) U.S. Cl. ................. 428/690; 428/917; 313/504; 313/506
(58) Field of Classification Search ............... 313/504, 313/506
See application file for complete search history.

(56) References Cited

U.S. PATENT DOCUMENTS

| 6,962,755 | B2 * | 11/2005 | Ise et al. ................... 428/690 |
| 2001/0019782 | A1 | 9/2001 | Igarashi et al. |
| 2002/0024293 | A1 | 2/2002 | Igarashi et al. |
| 2002/0086180 | A1 | 7/2002 | Seo et al. |
| 2002/0101154 | A1 | 8/2002 | Seo et al. |
| 2002/0125818 | A1 * | 9/2002 | Sato et al. ................... 313/504 |

FOREIGN PATENT DOCUMENTS

| EP | 1175128 A2 | 1/2002 |
| JP | 2002-117978 A | 4/2002 |
| JP | 2002-151267 A | 5/2002 |
| JP | 2002-305085 A | 10/2002 |
| JP | 2003-7467 A | 1/2003 |

OTHER PUBLICATIONS

European Office Action, Application No. 03 789 640.4-2111, Sep. 29, 2009, pp. 1-4.

* cited by examiner

*Primary Examiner*—Dawn Garrett
(74) *Attorney, Agent, or Firm*—Birch, Stewart, Kolasch & Birch, LLP

(57) ABSTRACT

An organic electroluminescent device comprising: a pair of electrodes; and at least one organic layer between the pair of electrodes, the at least one organic layer between the pair of electrodes, the at least one organic layer including a luminescent layer, wherein the luminescent layer contains at least one electron injection/transport compound, at least one hole injection/transport compound, and at least one green or blue phosphorescent compound; and the electron injection/transport compound and the hole injection/transport compound each has a minimum triplet exciton energy value which is equal to or more than that of the green or blue phosphorescent compound.

26 Claims, No Drawings

ORGANIC ELECTROLUMINESCENT DEVICE

TECHNICAL FIELD

The present invention relates to a luminescent device capable of converting electric energy to light to cause light emission, particularly an organic electroluminescent device and to an organic EL device that can be suitably utilized in the fields including display element, display, backlight, illumination light source, recording light source, exposure light source, reading light source, sign, signboard, interior, and optical communication.

BACKGROUND ART

In recent years, active research and development regarding organic electroluminescent devices (the organic electroluminescent device being sometimes referred to as "luminescent device", "organic EL device", or "EL device" in the invention) are carried out because light emission with a high luminance is obtained at low-voltage driving. In general, the organic EL device is constituted of counter electrodes having a luminescent layer or a plurality of organic layers containing a luminescent layer put therebetween. The organic EL device utilizes light emission from excitons formed by recombination of electrons injected from a cathode and holes injected from an anode in a luminescent layer, or utilizes light emission from excitons of other molecule formed by energy transfer from the foregoing excitons.

In an organic luminescent device comprising an anode, a cathode and an organic compound film, there is reported an organic luminescent device in which the organic compound film includes a hole transport region comprising a hole transport material and an electron transport region comprising an electron transport layer, a mixed region containing both the hole transport material and the electron transport material is provided between the hole transport region and the electron transport region, and a material capable of causing red light emission from the triplet excitation state is added in the mixed region (see, for example, JP-A-2002-305085). However, any means for improving efficiency and durability of blue and green EL devices is not disclosed at all.

DISCLOSURE OF THE INVENTION

An object of the invention is to provide a green or blue EL device having good luminous efficiency and durability. Another object of the invention is to provide a green or blue EL device having good luminous efficiency and durability using a specific compound in a luminescent layer.

The foregoing problems have been attained as follows.

(1) An organic electroluminescent device comprising a pair of electrode and at least one organic layer including a luminescent layer therebetween, wherein the luminescent layer contains at least one electron injection/transport compound, at least one hole injection/transport compound, and at least one green or blue phosphorescent compound; and the electron injection/transport compound and the hole injection/transport compound each has a minimum triplet exciton energy value ($T_1$ value) is equal to or more than that of the green or blue phosphorescent compound.

(2) The organic electroluminescent device as set forth above in (1), wherein the hole injection/transport compound has an ionization potential (Ip value) of from 5.6 eV to 6.1 eV.

(3) The organic electroluminescent device as set forth above in (1) or (2), wherein the electron injection/transport compound has an electron affinity (Ea value) of from 2.0 eV to 3.5 eV.

(4) The organic electroluminescent device as set forth above in any one of (1) to (3), wherein the green or blue phosphorescent compound is a transition metal complex capable of emitting light via the triplet excitation state.

(5) The organic electroluminescent device as set forth above in any one of (1) to (4), wherein the electron injection/transport compound, the hole injection/transport compound and the green or blue phosphorescent compound each has a $T_1$ value of 62 kcal/mole (259 kJ/mole) or more; and phosphorescence obtained from the green or blue phosphorescent compound has a λmax (emission maximum wavelength) of not longer than 500 nm.

(6) The organic electroluminescent device as set forth above in any one of (1) to (5), wherein the hole injection/transport compound is a substituted or unsubstituted pyrrole compound.

(7) The organic electroluminescent device as set forth above in (6), wherein the substituted or unsubstituted pyrrole compound is represented by the following formula (1).

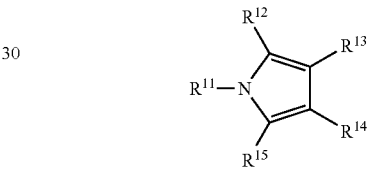

Formula (1)

In the formula, $R^{11}$ to $R^{15}$ each represents a hydrogen atom or a substituent, and the substituents may be bonded to each other to form a ring structure.

(8) The organic electroluminescent device as set forth above in (7), wherein the formula (1) is represented by the following formula (3).

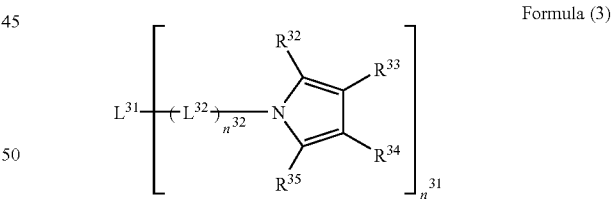

Formula (3)

In the formula, $R^{32}$ to $R^{35}$ are synonymous with $R^{12}$ to $R^{15}$, respectively; $L^{31}$ represents a connecting group; $L^{32}$ represents a di- or more valent connecting group; $n^{32}$ represents an integer of 2 or more; and $n^{32}$ represents an integer of from 0 to 6.

(9) The organic electroluminescent device as set forth above in any one of (1) to (5), wherein the electron injection/transport compound is a heterocyclic compound containing at least two nitrogen atoms.

(10) The organic electroluminescent device as set forth above in (9), wherein the heterocyclic compound containing at least two nitrogen atoms is a compound represented by the following formula (2).

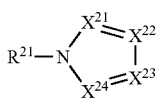

Formula (2)

In the formula, $R^{21}$ represents a hydrogen atom or a substituent; $X^{21}$, $X^{22}$, $X^{23}$, and $X^{24}$ each represents a nitrogen atom or a substituted or unsubstituted carbon atom; and at least one $X^{21}$, $X^{22}$, $X^{23}$, and $X^{24}$ represents a nitrogen atom.

(11) The organic electroluminescent device as set forth above in (10), wherein the formula (2) is represented by the following formula (4).

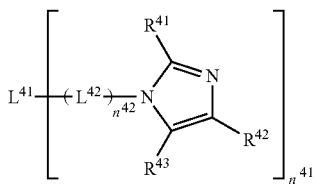

Formula (4)

In the formula, $R^{41}$, $R^{42}$, and $R^{43}$ each represents a hydrogen atom or a substituent; $L^{41}$ represents a connecting group; $n^{41}$ represents an integer of 2 or more; $L^{42}$ represents a di- or more valent connecting group; and $n^{42}$ represents an integer of from 0 to 6.

(12) The organic electroluminescent device as set forth above in (10), wherein the formula (2) is represented by the following formula (5).

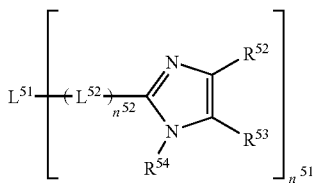

Formula (5)

In the formula, $R^{52}$, $R^{53}$, and $R^{54}$ each represents a hydrogen atom or a substituent; $L^{51}$ represents a connecting group; $n^{51}$ represents an integer of 2 or more; $L^{52}$ represents a di- or more valent connecting group; and $n^{52}$ represents an integer of from 0 to 6.

(13) The organic electroluminescent device as set forth above in (4), wherein the transition metal complex capable of emitting light via the triplet excitation state is at least one member selected from an iridium complex, a platinum complex, a rhenium complex, a ruthenium complex, a palladium complex, a rhodium complex, and a rare earth complex.

(14) The organic electroluminescent device as set forth above in any one of (1) to (13), wherein the organic layer has at least three layers of a hole transport layer, a luminescent layer, and an electron transport layer, and the electron transport layer has an Ip value of 5.9 eV or more.

(15) The organic electroluminescent device as set forth above in any one of (1) to (14), wherein the electron injection/transport compound contained in the luminescent layer is a compound different from the compound contained in the electron transport layer.

(16) The organic electroluminescent device as set forth above in any one of (1) to (15), wherein the hole injection/transport compound contained in the luminescent layer is a compound different from the compound contained in the hole transport layer.

(17) The organic electroluminescent device as set forth above in any one of (1) to (16), wherein the electron injection/transport compound contained in the luminescent layer is a transition metal complex not containing a substituted or unsubstituted 8-hydroxyquinolinol in a ligand thereof.

(18) The organic electroluminescent device as set forth above in any one of (1) to (17), wherein at least one of the hole injection/transport compounds contained in the luminescent layer is represented by the following formula (6).

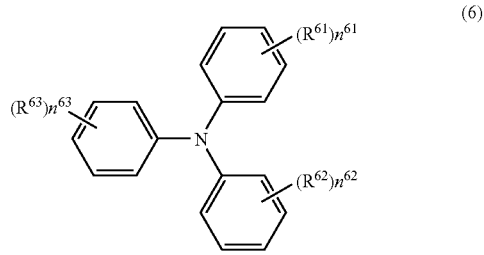

(6)

In the formula, $R^{61}$, $R^{62}$ and $R^{63}$ each represent a substituent. $n^{61}$ to $n^{63}$ each represent an integer of 0 to 5.

(19) The organic electroluminescent device as set forth above in any one of (1) to (18), wherein at least one of the hole injection/transport compounds contained in the luminescent layer is represented by the following formula (7).

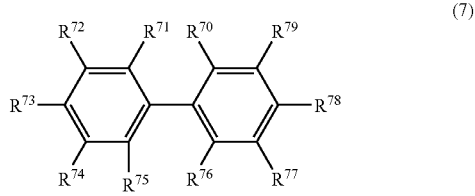

(7)

In the formula, $R^{70}$ to $R^{79}$ each represent a hydrogen atom, an alkyl group, an aryl group, or a group that forms a hydrocarbon ring when bonded to each other.

(20) The organic electroluminescent device as set forth above in any one of (1) to (19), wherein at least one of the electron injection/transport compounds contained in the luminescent layer is a nitrogen-containing six-membered ring compound.

(21) The organic electroluminescent device as set forth above in (20), wherein the nitrogen-containing six-membered ring compound is represented by the following formula (8), formula (9), formula (10) or general formula (11).

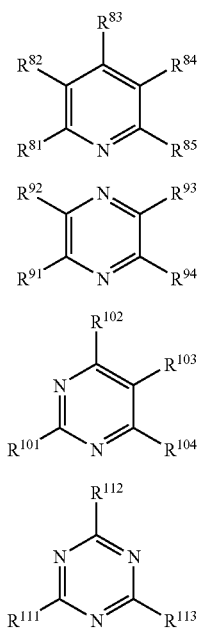

In the formulae, $R^{81}$ to $R^{85}$, $R^{91}$ to $R^{94}$, $R^{101}$ to $R^{104}$ and $R^{111}$ to $R^{113}$ each represents a hydrogen atom or a substituent.

(22) The organic electroluminescent device as set forth above in any one of (1) to (21), wherein at least one of the electron injection/transport compounds contained in the luminescent layer is a nitrogen-containing heterocyclic compound, and that at least one of the hole injection/transport compounds is a pyrrole compound.

(23) The organic electroluminescent device as set forth above in any one of (1) to (21), wherein at least one of the electron injection/transport compounds contained in the luminescent layer is a nitrogen-containing heterocyclic compound, and that at least one of the hole injection/transport compounds is a triarylamine-based compound.

(24) The organic electroluminescent device as set forth above in any one of (1) to (21), wherein at least one of the electron injection/transport compounds contained in the luminescent layer is a nitrogen-containing heterocyclic compound, and that at least one of the hole injection/transport compounds is a hydrocarbon-based aromatic compound.

(25) The organic electroluminescent device as set forth above in any one of (1) to (21), wherein at least one of the electron injection/transport compounds contained in the luminescent layer is a hydrocarbon-based aromatic compound, and that at least one of the hole injection/transport compounds is a triarylamine-based compound.

(26) The organic electroluminescent device as set forth above in any one of (1) to (21), wherein at least one of the electron injection/transport compounds contained in the luminescent layer is a hydrocarbon-based aromatic compound, and that at least one of the hole injection/transport compounds is a pyrrole compound.

(27) The organic electroluminescent device as set forth above in any one of (1) to (26), wherein the luminescent layer has at least one stacked layer structure of an electron injection/transport compound and a hole injection/transport compound.

(28) The organic electroluminescent device as set forth in any one of (1) to (26), wherein the luminescent layer contains a plurality of domain structures of an electron injection/transport compound and a hole injection/transport compound.

The invention is concerned with an organic electroluminescent device comprising a pair of electrode and at least one organic layer including a luminescent layer therebetween, wherein the luminescent layer contains at least one electron injection/transport compound, at least one hole injection/transport compound, and at least one green or blue phosphorescent compound; and the electron injection/transport compound and the hole injection/transport compound each has a minimum triplet exciton energy value ($T_1$ value) is equal to or more than that of the green or blue phosphorescent compound.

The luminescent layer contains at least three kinds of an electron injection/transport compound, a hole injection/transport compound, and a green or blue phosphorescent compound. The respective compounds should not be identical with each other (for example, the luminescent layer should not be constituted of only two kinds of compounds). However, for example, these compounds may be a polymer copolymer or oligomer comprising a skeleton (compound) having the respective function as a monomer unit. For example the luminescent layer may be constituted of a copolymer of a monomer unit functioning to inject/transport electrons and a monomer unit functioning to inject/transport holes and a compound of emitting phosphorescence.

The content of each of the electron injection/transport compound, the hole injection/transport compound, and the green or blue phosphorescent compound in the luminescent layer is not particularly limited, but it is preferable that at least one of the electron injection/transport compound and the hole injection/transport compound is the major component, whereas the green or blue phosphorescent compound is the subsidiary component.

In the EL device of the invention, it is preferable to use a layer containing a compound having an ionization potential of from 5.9 eV or more (more preferably 6.0 eV or more), and more preferably an electron transport layer having an ionization potential of 5.9 eV or more, between the cathode and the luminescent layer.

The invention is concerned with an organic luminescent device comprising a pair of electrode and at least one organic layer including a luminescent layer therebetween. The organic layer is preferably an organic layer including at least two layers of a luminescent layer and an electron injection/transport layer (the electron injection/transport layer being aligned in the cathode side), and more preferably an organic layer including at least three layers of a hole transport layer, a luminescent layer, and an electron transport layer, the electron transport layer having an Ip value of 5.9 eV. It is further preferable that the electron transport layer contains a compound represented by the formula (2).

(Electron Injection/Transport Compound)

An electron injection/transport compound contained in the luminescent layer implies a compound which plays the role of injecting and transporting electron in the luminescent layer. When such a compound is incorporated in the luminescent layer, the injection or transport of electron is promoted in some cases.

There are cases where a certain compound functions as an electron injection/transport compound or as a hole injection/ transport compound in the luminescent layer depending on the mode in which the compound is used. For example, a hydrocarbon-based aromatic compound functions as a hole injection/transport compound when used in conjunction with a compound with a high electron injection/transport capability (exemplified by a nitrogen-containing heterocyclic compound, a metal complex, etc.), and functions as an electron injection/transport compound when used in conjunction with a compound with a high hole injection/transport capability (exemplified by a triarylamine compound, etc.).

The electron injection/transport compound preferably has an electron affinity (Ea value) of from 2.0 eV to 3.5 eV, more preferably from 2.3 eV to 3.4 eV, and further preferably from 2.5 eV to 3.3 eV.

The content of the electron injection/transport compound in the luminescent layer is preferable from 5% by weight to 90% by weight, more preferably from 10% by weight to 85% by weight, further preferably from 10% by weight to 80% by weight, and especially preferably from 10% by weight to 75% by weight.

Preferred examples of the electron injection/transport compound include metal complexes (such as aluminum complexes and zinc complexes each comprising 2-hydroxyphenylbenzoimidazole ligand, provided that complexes comprising an 8-hydroxyquinolinol derivative (such as 2-methyl-8-hydroxyquinolinol) as a ligand thereof are not preferable), nitrogen-containing heterocyclic compounds (such as azole derivatives, pyridine derivatives, and triazine derivatives), organosilicon compounds (such as silole derivatives, aryl silane derivatives), and aromatic hydrocarbon compound (such as benzene, anthracene, pyrene) Of these compounds, heterocyclic compounds containing at least two nitrogen atoms and metal complexes are more preferable; heterocyclic compounds containing at least two nitrogen atoms are further preferable; and compounds represented by the formula (2) are preferable as heterocyclic compounds containing at least two nitrogen atoms. Also, compounds represented by the formulae (A-III), (A-IV), (A-V), (A), (A-a), (A-b), (A-c), (B-II), (B-III), (B-IV), (B-V), (B-VI), (B-VII), (B-VIII), and (B-IX) as described in JP-A-2002-100476 and compounds represented by the formulae (1) to (4) as described in JP-A-2000-302754 can be suitably used (preferred ranges thereof are described in JP-A-2002-100476 and JP-A-2000-302754).

The formula (2) will be described below. $R^{21}$ represents a hydrogen atom or a substituent. As the substituent on $R^{21}$, the after-mentioned groups described for $R^{11}$ are enumerated. $R^{21}$ is preferably an alkyl group, an aryl group, or a heteroaryl group; more preferably an aryl group or a heteroaryl group; and further preferably an aryl group and a nitrogen-containing heteroaryl group.

$X^{21}$, $X^{22}$, $X^{23}$, and $X^{24}$ each represents a nitrogen atom or a substituted or unsubstituted carbon atom. At least one of $X^{21}$, $X^{22}$, $X^{23}$, and $X^{24}$ is a nitrogen atom. As the substituent on the carbon atom, the after-mentioned groups described for $R^{12}$ are enumerated. Above all, an alkyl group, an aryl group, and a heteroaryl group are preferable.

It is preferable that $X^{21}$ is a substituted or unsubstituted carbon atom, $X^2$ is a nitrogen atom, and $X^{23}$ and $X^{24}$ are each a substituted carbon atom. Also, it is preferable that the substituents on $X^{23}$ and $X^{24}$ are bonded to each other to form an aromatic ring.

A preferred embodiment of the compound represented by the formula (2) is a compound represented by the formula (4) or formula (5); and a more preferred embodiment of the compound represented by the formula (2) is a compound represented by the formula (4).

The formula (4) will be described below. $R^{41}$, $R^{42}$, and $R^{43}$ each represents a hydrogen atom or a substituent. As the substituent, for example, the after-mentioned groups described for $R^{12}$ are enumerated.

$R^{41}$ is preferably an alkyl group, an aryl group, or a heteroaryl group; more preferably an alkyl group or an aryl group; and further preferably an alkyl group.

$R^{42}$ and $R^{43}$ are each preferably an alkyl group, an aryl group, a heteroaryl group, or a group capable of forming an aromatic ring upon bonding to each other; and more preferably a group capable of forming an aromatic ring upon bonding to each other.

$L^{41}$ represents a connecting group. The connecting group may be a polymer main chain of polyalkylene, polyester, etc. (for example, it may form a polyvinylimidazole derivative). $L^{41}$ is preferably an aryl connecting group, a heteroaryl connecting group, an alkyl connecting group, or an alkylene polymer main chain; more preferably an aryl connecting group or a heteroaryl connecting group; and further preferably a nitrogen-containing heteroaryl connecting group.

$n^{41}$ represents an integer of 2 or more. In the case where $L^{41}$ is not a polymer main chain, $n^{41}$ is preferably from 2 to 6, and more preferably from 3 to 4. In the case where $L^{41}$ is a polymer main chain, $n^{41}$ is a value corresponding to the repeating unit of the polymer main chain (for example, in the case of a 100 mer of vinylbenzimidazole, $n^{41}$ is 100).

$L^{42}$ and $n^{42}$ are synonymous with the after-mentioned $L^{32}$ and $n^{32}$, respectively, and preferred ranges thereof are also the same.

The formula (5) will be described below. $R^{52}$ and $R^{53}$ each represents a hydrogen atom or a substituent. As the substituent, for example, the after-mentioned groups described for $R^{12}$ are enumerated.

$R^{52}$ and $R^{53}$ are each preferably an alkyl group, an aryl group, a heteroaryl group, or a group capable of forming an aromatic ring upon bonding to each other; more preferably a group capable of forming an aromatic ring upon bonding to each other; and further preferably a group capable of forming a nitrogen-containing aromatic ring upon bonding to each other.

$R^{54}$ represents a hydrogen atom or a substituent. As the substituent, for example, the after-mentioned groups described for $R^{11}$ are enumerated. $R^{54}$ is preferably an alkyl group, an aryl group, or a heteroaryl group; more preferably an aryl group or a heteroaryl group; and further preferably an aryl group.

$L^{51}$, $L^{52}$, $n^{51}$, and $n^{52}$ are synonymous with the foregoing $L^{41}$, $L^{42}$, $n^{41}$, and $n^{42}$, respectively, and preferred ranges thereof are also the same.

As the electron injection/transport compound of the present invention, a nitrogen-containing six-membered cyclic compound is also preferred. Such nitrogen-containing six-membered cyclic compounds, which have no special limitation, include, for example, pyridine, pyrazine, pyrimidine, pyridazine, triazine, and condensed ring compounds comprising these rings (quinoline, quinoxaline, etc.). And nitrogen-containing six-membered monocyclic compounds are more preferred.

As the nitrogen-containing 6-membered cyclic compound, those represented by formulae (8) to (11) are preferred, those represented by formulae (8), (10) and (11) are more preferred, those represented by formulae (8) and (11) are still more preferred, and those represented by formula (11) are particularly preferred.

Formulae (8) to (11) will be explained. $R^{81}$ to $R^{85}$, $R^{91}$ to $R^{94}$, $R^{101}$ to $R^{104}$ and $R^{111}$ to $R^{113}$ each represent a hydrogen atom, or a substituent. And as such a substituent, those explained as $R^{11}$ to be shown later are mentioned. The substituents may be bonded with each other to form a condensed ring structure (exemplified by benzo-condensed ring, pyridine-condensed ring, etc.).

$R^{81}$ to $R^{85}$, $R^{91}$ to $R^{94}$, $R^{101}$ to $R^{104}$ and $R^{111}$ to $R^{113}$ each preferably represent a hydrogen atom, an alkyl group, an aryl group, a heteroaryl group, a fluorine atom, and an amino group. But among them, a hydrogen atom, an aryl group, a heteroaryl group are more preferred.

Further, as the electron injection/transport compound of the invention, nitrogen-containing 5- or 6-membered cyclic compounds represented by formulae (I) and (II) set forth in JP-A-2002-356489, and represented by formula (I) set forth in JP-A-2002-338579 are preferred. The preferable range of these compounds, and compound examples are described in JP-A-2002-356489 and JP-A-2002-338579.

(Hole Injection/Transport Compound)

A hole injection/transport compound contained in the luminescent layer implies a compound which plays the role of injecting and transporting hole in the luminescent layer. When such a compound is incorporated in the luminescent layer, the injection or transport of hole is promoted in some cases.

There are cases where a certain compound functions as a hole injection/transport compound or as an electron injection/transport compound in the luminescent layer depending on the mode in which the compound is used. For example, a hydrocarbon-based aromatic compound functions as a hole injection/transport compound when used in conjunction with a compound with a high electron injection/transport capability (exemplified by a nitrogen-containing heterocyclic compound, a metal complex, etc.), and functions as an electron injection/transport compound when used in conjunction with a compound with a high hole injection/transport capability (exemplified by a triarylamine compound, etc.).

The hole injection/transport compound preferably has an Ip value (ionization potential) of from 5.6 eV to 6.1 eV, more preferably from 5.7 eV to 6.1 eV, further preferably from 5.7 eV to 6.0 eV, and especially preferably from 5.8 eV to 6.0 eV.

The concentration of the hole injection/transport compound in the luminescent layer is preferably from 10% by weight to 95% by weight, more preferably from 15% by weight to 90% by weight, further preferably from 30% by weight to 85% by weight, and especially preferably from 30% by weight to 80% by weight.

Preferred examples of the hole injection/transport compound include hydrocarbon based aromatic derivatives (such as benzene derivatives, anthracene derivatives, and pyrene derivatives), pyrrole derivatives (such as pyrrole derivatives, indole derivatives, and carbazole derivatives), and azepine derivatives (such as tribenzoazepine derivatives). Of these compounds, pyrrole derivatives are more preferable, and compounds represented by the formula (1) are further preferable.

The formula (1) will be described below. $R^{11}$ to $R^{15}$ each represents a hydrogen atom or a substituent, and the substituents may be bonded to each other to form a ring structure (such as a benzene ring and a pyridine ring). Examples of the substituent represented by $R^{11}$ include an alkyl group (preferably ones having from 1 to 30 carbon atoms, more preferably from 1 to 20 carbon atoms, and especially preferably from 1 to 10 carbon atoms, such as a methyl group, an ethyl group, an isopropyl group, a t-butyl group, an n-octyl group, an n-decyl group, an n-hexadecyl group, a cyclopropyl group, a cyclopentyl group, and a cyclohexyl group), an alkenyl group (preferably ones having from 2 to 30 carbon atoms, more preferably from 2 to 20 carbon atoms, and especially preferably from 2 to 10 carbon atoms, such as a vinyl group, an allyl group, a 2-butenyl group, and a 3-pentenyl group), an alkynyl group (preferably ones having from 2 to 30 carbon atoms, more preferably from 2 to 20 carbon atoms, and especially preferably from 2 to 10 carbon atoms, such as a propargyl group and a 3-pentynyl group), an aryl group (preferably ones having from 6 to 30 carbon atoms, more preferably from 6 to 20 carbon atoms, and especially preferably from 6 to 12 carbon atoms, such as a phenyl group, a p-methylphenyl group, a naphthyl group, and an anthranyl group), an acyl group (preferably ones having from 1 to 30 carbon atoms, more preferably from 1 to 20 carbon atoms, and especially preferably from 1 to 12 carbon atoms, such as an acetyl group, a benzoyl group, a formyl group, and a pivaloyl group), a sulfonyl group (preferably ones having from 1 to 30 carbon atoms, more preferably from 1 to 20 carbon atoms, and especially preferably from 0.1 to 12 carbon atoms, such as a mesyl group and a tosyl group), a heterocyclic group (preferably ones having from 1 to 30 carbon atoms and more preferably from 1 to 12 carbon atoms, in which examples of the hetero atom include a nitrogen atom, an oxygen atom, and a sulfur atom, such as an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, and an azepinyl group), and a silyl group (preferably ones having from 3 to 40 carbon atoms, more preferably from 3 to 30 carbon atoms, and especially preferably from 3 to 24 carbon atoms, such as a trimethylsilyl group and a triphenylsilyl group). These substituents may further be substituted. Examples of the substituent represented by $R^{12}$ to $R^{15}$ include ones of the following substituent group A.

(Substituent Group A)

Examples include an alkyl group (preferably ones having from 1 to 30 carbon atoms, more preferably from 1 to 20 carbon atoms, and especially preferably from 1 to 10 carbon atoms, such as a methyl group, an ethyl group, an isopropyl group, a t-butyl group, an n-octyl group, an n-decyl group, an n-hexadecyl group, a cyclopropyl group, a cyclopentyl group, and a cyclohexyl group), an alkenyl group (preferably ones having from 2 to 30 carbon atoms, more preferably from 2 to 20 carbon atoms, and especially preferably from 2 to 10 carbon atoms, such as a vinyl group, an allyl group, a 2-butenyl group, and a 3-pentenyl group), an alkynyl group (preferably ones having from 2 to 30 carbon atoms, more preferably from 2 to 20 carbon atoms, and especially preferably from 2 to 10 carbon atoms, such as a propargyl group and a 3-pentynyl group), an aryl group (preferably ones having from 6 to 30 carbon atoms, more preferably from 6 to 20 carbon atoms, and especially preferably from 6 to 12 carbon atoms, such as a phenyl group, a p-methylphenyl group, a naphthyl group, and an anthranyl group), an amino group (preferably ones having from 0 to 30 carbon atoms, more preferably from 0 to 20 carbon atoms, and especially preferably from 0 to 10 carbon atoms, such as an amino group, a methylamino group, a dimethylamino group, a diethylamino group, a dibenzylamino group, a diphenylamino group, and a ditolylamino group), an alkoxy group (preferably ones having from 1 to 30 carbon atoms, more preferably from 1 to 20 carbon atoms, and especially preferably from 1 to 10 carbon atoms, such as a methoxy group, an ethoxy group, a butoxy group, and a 2-ethylhexyloxy group), an aryloxy group (preferably ones having from 6 to 30 carbon atoms, more preferably from 6 to 20 carbon atoms, and especially preferably from 6 to 12 carbon atoms, such as a phenyloxy group, a 1-naphthyloxy group, and a 2-naphthyloxy group), a heterocyclic oxy group (preferably ones having from 1 to 30 carbon atoms, more preferably from 1 to 20 carbon atoms, and especially preferably from 1 to 12 carbon atoms, such as a pyridyloxy group, a pyrazyloxy group, a pyrimidyloxy group, and a quinolyloxy group), an acyl group (preferably ones having from 1 to 30 carbon atoms, more preferably from 1 to 20 carbon atoms, and especially preferably from 1 to 12 carbon atoms, such as an acetyl group, a benzoyl group, a formyl group, and a pivaloyl group), an alkoxycarbonyl group (preferably ones having from 2 to 30 carbon atoms, more preferably from 2 to 20 carbon atoms, and especially preferably from 2 to 12 carbon atoms, such as a methoxycarbonyl group and an ethoxycarbonyl group), an aryloxycarbonyl group (preferably ones having from 7 to 30 carbon atoms, more preferably from 7 to 20 carbon atoms, and especially preferably from 7 to 12 carbon atoms, such as a phenyloxycarbonyl group), an acyloxy group (preferably ones having from 2 to 30 carbon atoms, more preferably from 2 to 20 carbon atoms, and especially preferably from 2 to 10 carbon atoms, such as an acetoxy group and a benzoyloxy group), an acylamino group (preferably ones having from 2 to 30 carbon atoms, more preferably from 2 to 20 carbon atoms, and especially preferably from 2 to 10 carbon atoms, such as an acetylamino group and a benzoylamino group), an alkoxycarbonylamino group (preferably ones having from 2 to 30 carbon atoms, more preferably from 2 to 20 carbon atoms, and especially preferably 2 to 12 carbon atoms, such as a methoxycarbonylamino group), an aryloxycarbonylamino group (preferably ones having from 7 to 30 carbon atoms, more preferably from 7 to 20 carbon atoms, and especially preferably from 7 to 12 carbon atoms, such as a phenyloxycarbonylamino group), a sulfonylamino group (preferably ones having from 1 to 30 carbon atoms, more preferably from 1 to 20 carbon atoms, and especially preferably from 1 to 12 carbon atoms, such as a methanesulfonylamino group and a benzenesulfonylamino group), a sulfamoyl group (preferably ones having from 0 to 30 carbon atoms, more preferably from 0 to 20 carbon atoms, and especially preferably from 0 to 12 carbon atoms, such as a sulfamoyl group, a methylsulfamoyl group, a dimethylsulfamoyl group, and a phenylsulfamoyl group), a carbamoyl group (preferably ones having from 1 to 30 carbon atoms, more preferably from 1 to 20 carbon atoms, and especially preferably from 1 to 12 carbon atoms, such as a carbamoyl group, a methylcarbamoyl group, a diethylcarbamoyl group, and a phenylcarbamoyl group), an alkylthio group (preferably ones having from 1 to 30 carbon atoms, more preferably from 1 to 20 carbon atoms, and especially preferably from 1 to 12 carbon atoms, such as a methylthio group and an ethylthio group), an arylthio group (preferably ones having from 6 to 30 carbon atoms, more preferably from 6 to 20 carbon atoms, and especially preferably from 6 to 12 carbon atoms, such as a phenylthio group), a heterocyclic thio group (preferably ones having from 1 to 30 carbon atoms, more preferably from 1 to 20 carbon atoms, and especially preferably from 1 to 12 carbon atoms, such as a pyridylthio group, a 2-benzimidazolylthio group, a 2-benzoxazolylthio group, and a 2-benzthiazolylthio group), a sulfonyl group (preferably ones having from 1 to 30 carbon atoms, more preferably from 1 to 20 carbon atoms, and especially preferably from 1 to 12 carbon atoms, such as a mesyl group and tosyl group), a sulfinyl group (preferably ones having from 1 to 30 carbon atoms, more preferably from 1 to 20 carbon atoms, and especially preferably from 1 to 12 carbon atoms, such a methanesulfinyl group and a benzenesulfinyl group), a ureido group (preferably ones having from 1 to 30 carbon atoms, more preferably from 1 to 20 carbon atoms, and especially preferably from 1 to 12 carbon atoms, such as a ureido group, a methylureido group, and a phenylureido group), a phosphoric acid amide group (preferably ones having from 1 to 30 carbon atoms, more preferably from 1 to 20 carbon atoms, and especially preferably from 1 to 12 carbon atoms, such as a diethylphosphoric acid amide group and a phenylphosphoric acid amide group), a hydroxyl group, a mercapto group, a halogen atom (such as a fluorine atom, a chlorine atom, a bromine atom, and an iodine atom), a cayno group, a sulfo group, a carboxyl group, a nitro group, a hydroxamic acid group, a sulfino group, a hydrazino group, an imino group, a heterocyclic group (preferably ones having from 1 to 30 carbon atoms and more preferably from 1 to 12 carbon atoms, in which examples of the hetero atom include a nitrogen atom, an oxygen atom, and a sulfur atom, such as an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, and an azepinyl group), a silyl group (preferably ones having from 3 to 40 carbon atoms, more preferably from 3 to 30 carbon atoms, and especially preferably from 3 to 24 carbon atoms, such as a trimethylsilyl group and a triphenylsilyl group), and a silyloxy group (preferably ones having from 3 to 40 carbon atoms, more preferably from 3 to 30 carbon atoms, and especially preferably from 3 to 24 carbon atoms, such as a trimethylsiloxy group and a triphenylsilyloxy group). These substituents may further be substituted.

$R^{11}$ is preferably an alkyl group, an aryl group, or a heteroaryl group, and more preferably an alkyl group or an aryl group.

$R^{12}$ to $R^{15}$ are each preferably a hydrogen atom, an alkyl group, or a group capable of forming a benzene ring upon bonding to each other. The compound represented by the formula (1) is preferably a substituted or unsubstituted indole or a substituted or unsubstituted carbazole.

The compound represented by the formula (1) is preferably a compound represented by the formula (3).

The formula (3) will be described below. $R^{32}$ to $R^{35}$ are synonymous with the foregoing $R^{12}$ to $R^{15}$, respectively, and preferred ranges thereof are also the same.

$L^{31}$ represents a connecting group. The connecting group may be a polymer main chain of polyalkylene, polyester, etc. (for example, it may form a polyvinylpyrrole derivative). $L^{31}$ is preferably an aryl connecting group, a heteroaryl connecting group, an alkyl connecting group, an amino connecting group ($n^{32}$ preferably represents an integer of 1 or more), or an alkylene polymer main chain, and more preferably an aryl connecting group, an amino connecting group ($n^{32}$ preferably represents an integer of 1 or more) or an alkylene main chain.

$L^{32}$ represents a di- or more valent connecting group. $L^{32}$ is preferably an alkylene group, an arylene group, a heteroarylene group, an oxygen connecting group, a carbonyl connecting group, or an amino connecting group, and more preferably an alkylene group or an arylene group.

$n^{31}$ represents an integer of 2 or more. In the case where $n^{31}$ is plural, plural nitrogen-containing heterocyclic groups may be the same or different. In the case where $L^{32}$ is not a polymer main chain, $n^{31}$ is preferably from 2 to 6, and more preferably from 3 to 4. In the case where $L^{31}$ is a polymer main chain, $n^{31}$ is a value corresponding to the repeating unit of the polymer main chain (for example, in the case of a 100 mer of vinylcarbazole, $n^{31}$ is 100).

$n^{32}$ represents an integer of from 0 to 6, preferably from 0 to 3, and more preferably 0 or 1. In the case where $n^{32}$ is plural, plural $L^{32}$'s may be the same or different.

The electron injection/transport compound and the hole injection/transport compound each preferably has a glass transition point of 100° C. to 500° C., more preferably from 110° C. to 300° C., and further preferably from 120° C. to 250° C.

As the triarylamine derivatives used as a hole injection/transport compound, those represented by formula (6) are preferred.

Formula (6) will be explained. $R^{61}$, $R^{62}$ and $R^{63}$ each represent a substituent. As the substituent, the groups described as the aforementioned $R^{11}$ are mentioned. Two substituents may be bonded to each other to form a cyclic structure. $R^{61}$, $R^{62}$ and $R^{63}$ each represent an alkyl group, an aryl group, a heteroaryl group, an alkenyl group, an alkoxy group, and an amino group. Among them, an alkyl group, an aryl group, and a heteroaryl group are more preferred, and an aryl group (for example, phenyl group, naphthyl group, phenanthryl group, triphenylenyl group, futraphenylenyl group, etc.), a heteroaryl group (for example, pyridyl group, pyrazyl group, pyrimidyl group, triazyl group, benzoimidazolyl group, benzoxazolyl group, oxadiazolyl group, etc.) are still more preferred.

$n^{61}$, $n^{62}$ and $n^{63}$ each represent an integer of from 0 to 5 whereby 1 to 5 are preferred and 1 to 3 is more preferred. In cases where $n^{61}$, $n^{62}$ and $n^{63}$ are 2 to 5, plural $R^{61}$, $R^{62}$ and $R^{63}$ may be the same or different from each other.

As the triarylamine derivative represented by formula (6), a monoamine derivative (which has only one triarylamine structure in the molecule) is preferred.

As the hydrocarbon-based aromatic compound used as the hole injection/transport compound, those compounds represented by formula (7) are preferred.

Explanation will be given on Formulae (7).

$R^{70}$ and $R^{71}$ each represent an alkyl group, an aryl group, and one capable of forming a hydrocarbon ring (such as, for example, naphthalene ring, phenanthrene ring, triphenylene ring, tetraphenylene ring, etc.) upon bonding to each other. These substituents may further have a substituent (such as those explained as the foregoing $R^{11}$).

Each of $R^{70}$ and $R^{71}$ is preferably a hydrogen atom, an aryl group or a group capable of forming a hydrocarbon ring upon bonding to each other. In particular, it is preferred that at least two of $R^{70}$ and $R^{71}$ are aryl groups, or that at least one pair of $R^{70}$ and $R^{71}$ is a group capable of forming a hydrocarbon ring upon bonding to each other.

(Green or Blue Phosphorescent Compound)

The green or blue phosphorescent compound (sometimes referred to simply as "phosphorescent compound" in this specification) to be used in the invention means a compound that when contained in the luminescent layer of the EL device, emits green or blue phosphorescence by energy transfer from the electron injection/transport compound and/or the hole injection/transport compound by application of an electric field between a pair of electrodes. Though the green or blue phosphorescent compound is not particularly limited, ones capable of simultaneously emitting fluorescence may be employed. Compounds that when contained in the luminescent layer of the EL device, have a phosphorescent intensity of 2 times or more as compared with the fluorescent intensity to be emitted from the luminescent layer of the organic EL device are preferable. Of these compounds, those having a phosphorescent intensity of 10 times or more are more preferable, and those having a phosphorescent intensity of 100 times or more are further preferable.

Emission of green or blue phosphorescence means that the peak wavelength of the phosphorescent emission light lies between 400 nm and 590 nm, preferably between 410 nm and 570 nm, more preferably between 410 nm and 560 nm, and still more preferably between 420 nm and 550 nm.

In the invention, as the phosphorescent compound, transition metal complexes capable of emitting fluorescence are preferable; iridium complexes, platinum complexes, rhenium complexes, ruthenium complexes, palladium complexes, rhodium complexes, and rare earth complexes are more preferable; iridium complexes and platinum complexes are further preferable; orthocarbometalated iridium complexes are especially preferable; and orthocarbometalated iridium complexes having a difluorophenylpyridine ligand are most preferable. Also, orthocarbometalated iridium complexes having a difluorophenylpyridine ligand described in JP-A-2002-235076, JP-A-2002-170684, and Japanese Patent Application Nos. 2001-239281 and 2001-248165 are preferable.

Furthermore, such phosphorescent compounds emitting blue to green light can also be used which are set forth in various patent literatures including U.S. Pat. No. 6,303,238 B1, U.S. Pat. No. 6,097,147, WO 00/57676, WO 00/70655, WO 01/08230, WO 01/39234 A2, WO 01/41512 A1, WO 02/02714 A2, WO 02/15645 A1, JP-A-2001-247859, Japanese Patent Application No. 2000-33561, Japanese Patent Application No. 2001-189539, Japanese Patent Application No. 2001-248165, Japanese Patent Application No. 2001-33684, Japanese Patent Application No. 2001-239281, Japanese Patent Application No. 2001-219909, EP 1211257, JP-A-2002-226495, JP-A-2002-234894, JP-A-2001-247859, JP-A-2001-298470, JP-A-2002-173674, JP-A-2002-203678, JP-A-2002-203679, etc.

In the invention, the concentration of the phosphorescent compound in the luminescent layer is preferably from 1% by weight to 30% by weight, more preferably from 2% by weight to 20% by weight, and further preferably from 3% by weight to 15% by weight.

The phosphorescence obtained from the phosphorescent compound of the EL device of the invention preferably has, as regards the blue electroluminescent device, a % max (emission maximum wavelength) of from 350 nm to 500 nm, more preferably from 400 nm to 500 nm, and further preferably from 420 nm to 500 nm.

In the EL device of the invention, as regards the blue electroluminescent device, it is preferable that the electron injection/transport compound, the hole injection/transport compound and the phosphorescent compound of the invention each has a $T_1$ value of 62 kcal/mole or more, and the phosphorescence obtained from the phosphorescent compound of the invention has a λmax (emission maximum wavelength) of from 350 nm to 500 nm; it is more preferable that the electron injection/transport compound, the hole injection/transport compound and the phosphorescent compound of the invention each has a $T_1$ value of 63 kcal/mole or more, and the phosphorescence obtained from the phosphorescent compound of the invention has a λmax (emission maximum wavelength) of from 350 nm to 490 nm; it is further preferable that the electron injection/transport compound, the hole injection/transport compound and the phosphorescent compound of the invention each has a $T_1$ value of 64 kcal/mole or more, and the phosphorescence obtained from the phosphorescent compound of the invention has a λmax (emission maximum wavelength) of from 350 nm to 480 nm; and it is especially preferable that the electron injection/transport compound, the hole injection/transport compound and the phosphorescent compound of the invention each has a $T_1$ value of 65 kcal/mole or more, and the phosphorescence obtained from the phosphorescent compound of the invention has a λmax (emission maximum wavelength) of from 350 nm to 475 nm. (for reference, 1 kcal/mole can be converted to 4.184 kJ/mol.)

As regards the green electroluminescent device among the EL device of the invention, it is preferable that the electron injection/transport compound, the hole injection/transport compound and the phosphorescent compound each have a $T_1$ value of 53 kcal/mole or more, and the phosphorescence obtained from the phosphorescent compound of the invention has a λmax (maximum emission wavelength) of from 590 nm or shorter; it is more preferable that the electron injection/transport compound, the hole injection/transport compound and the phosphorescent compound each have a $T_1$ value of 55 kcal/mole or more, and the phosphorescence obtained from the phosphorescent compound has a λmax (maximum emission wavelength) of 570 nm or shorter; it is still more preferable that the electron injection/transport compound, the hole injection/transport compound and the phosphorescent compound each have a $T_1$ value of 56 kcal/mole or more, and the phosphorescence obtained from the phosphorescent compound of the invention has a λmax (emission maximum wavelength) of 560 nm or shorter; and it is especially preferable that the electron injection/transport compound, the hole injection/transport compound and the phosphorescent compound each have a $T_1$ value of 57 kcal/mole or more, and the phosphorescence obtained from the phosphorescent compound of the invention has a % max (emission maximum wavelength) of 550 nm or shorter.

The phosphorescent life (at room temperature) of the phosphorescent compound of the invention is not specifically limited, but is preferably 1 ms or less, more preferably 100 μs or less, and still more preferably 10 μs or less.

The compounds represented by the formulae (1) to (5) of the invention may be each a low-molecular compound or may be an oligomer compound or a polymer compound (the weight average molecular weight (as reduced into polystyrene) is preferably 1,000 to 5,000,000, more preferably from 2,000 to 1,000,000, and further preferably from 3,000 to 100,000). In the case of the polymer compound, each of the structures of the formulae (1) to (5) may be contained in the polymer main chain or may be contained in the polymer side chain. Also, in the case of the polymer compound, the polymer compound may be a homopolymer compound or a copolymer.

Next, specific examples of the compounds of the invention will be given below, but it should not be construed that the invention is limited thereto.

A-1

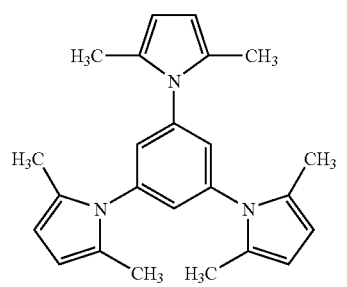

-continued

A-2

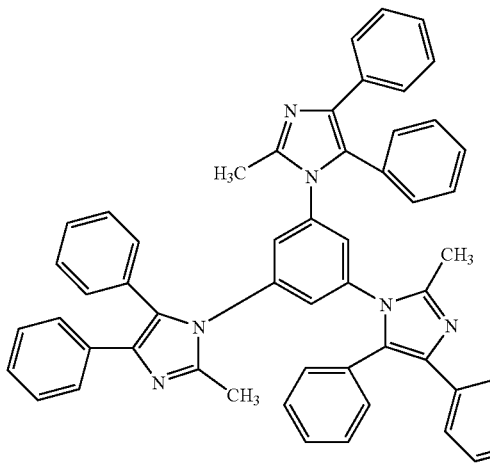

A-3

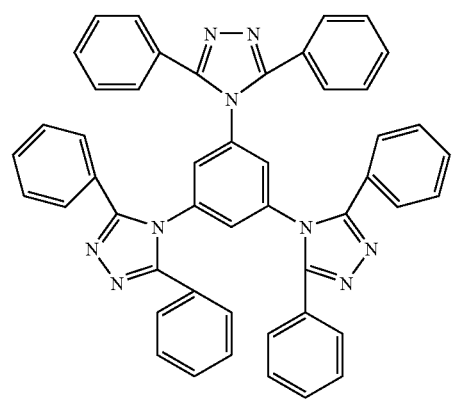

A-4

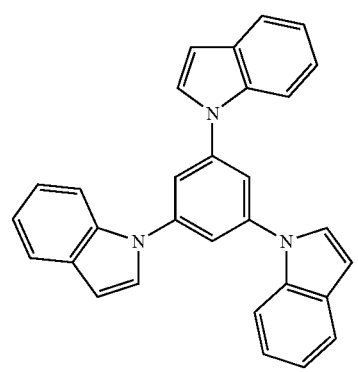

A-5

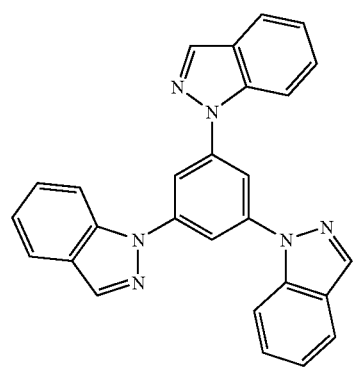

-continued
A-6
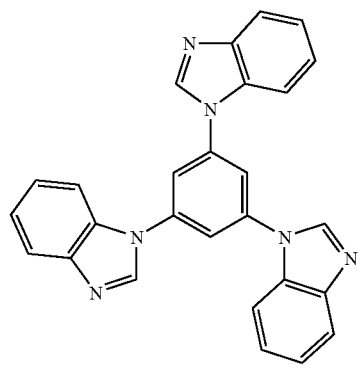
A-7
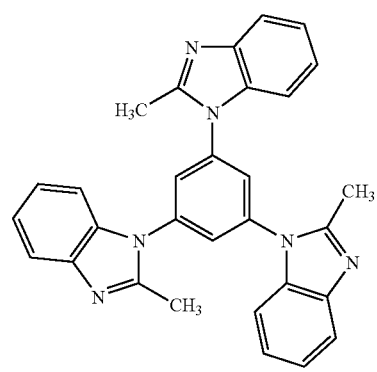
A-8
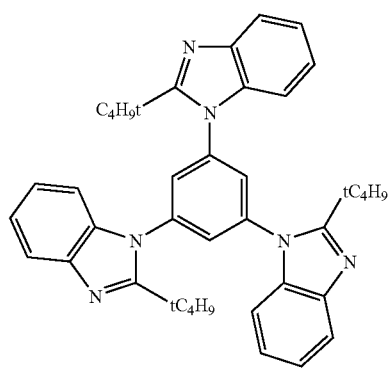
A-9
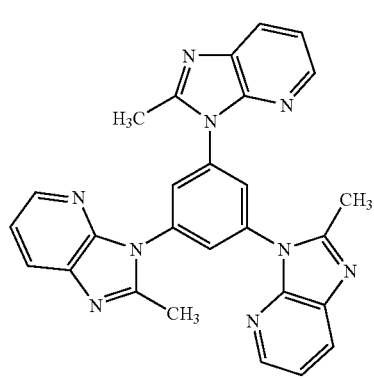
-continued
A-10
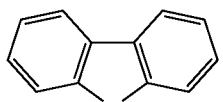
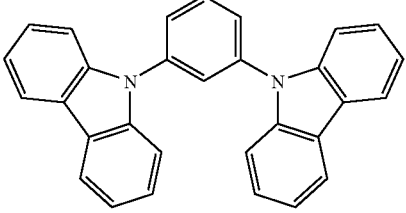
A-11
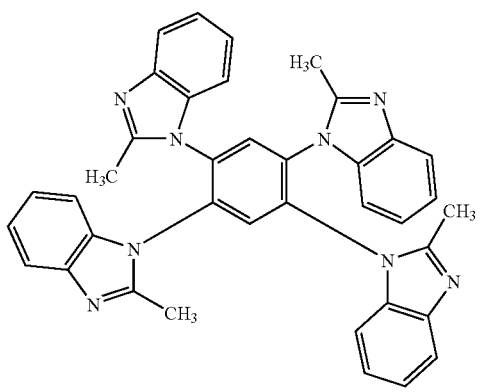
A-12
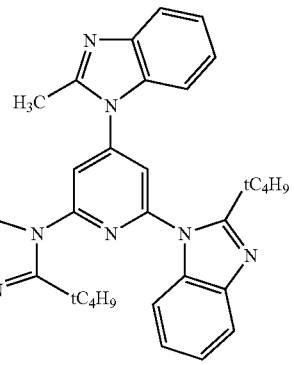
A-13
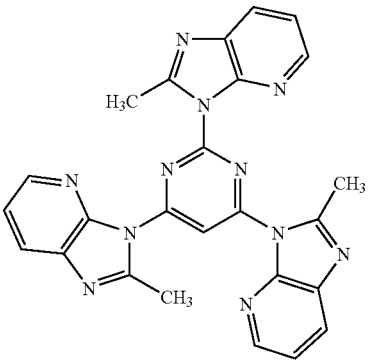

-continued
A-14
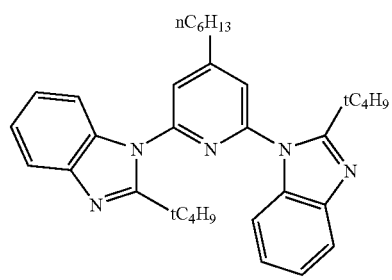
A-15
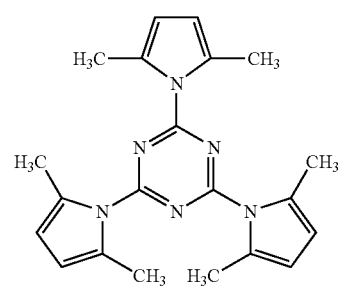
A-16
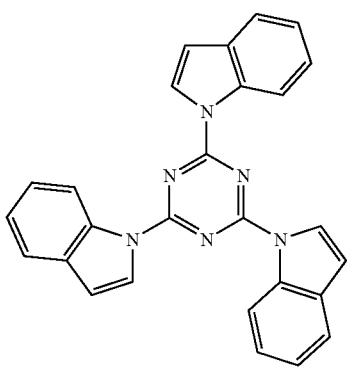
A-17
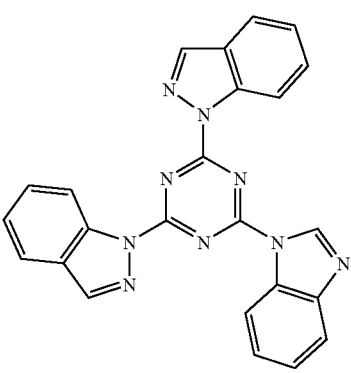
-continued
A-18
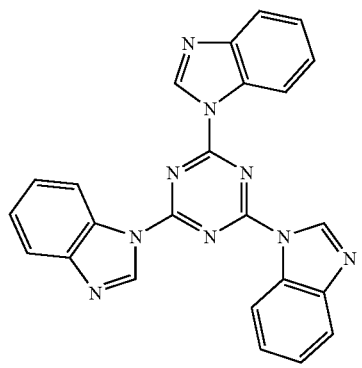
A-19
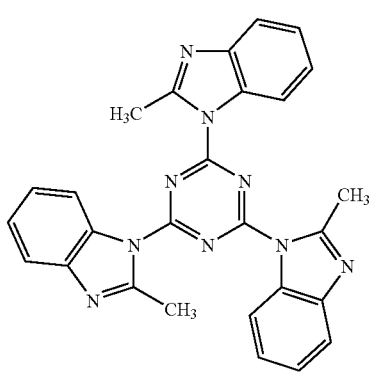
A-20
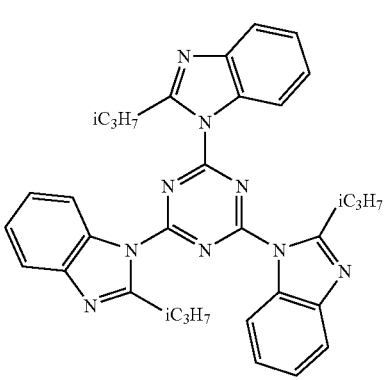
A-21
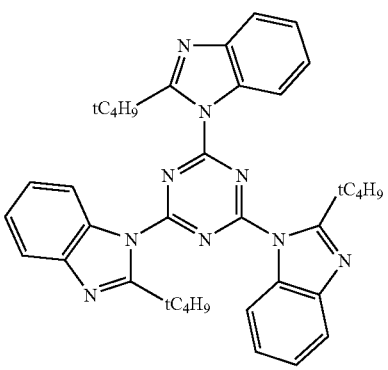

-continued
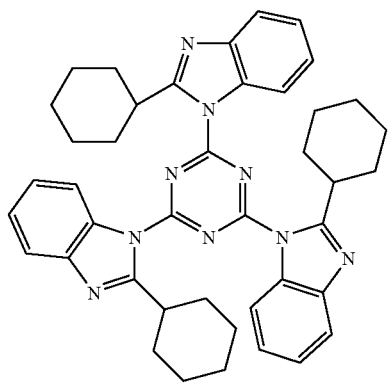
A-22
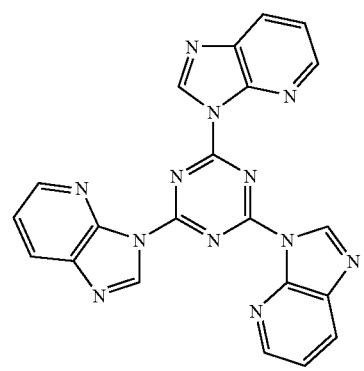
A-23
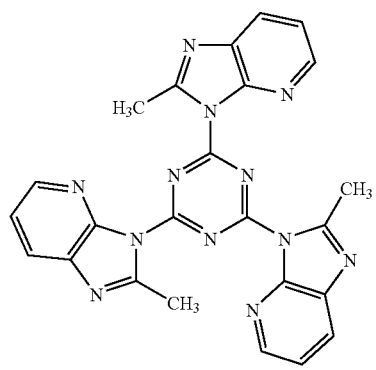
A-24
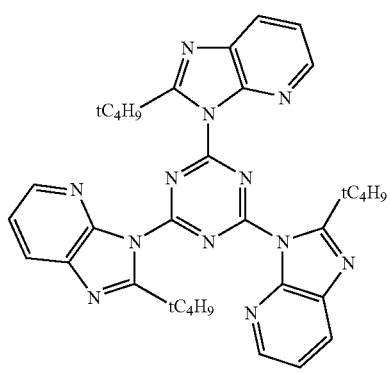
A-25
-continued
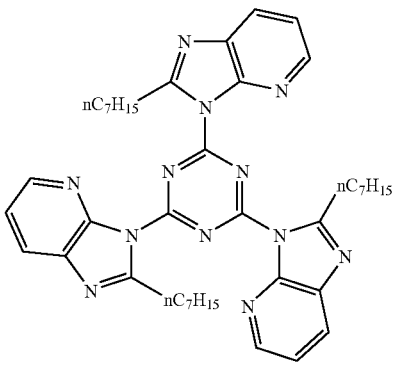
A-26
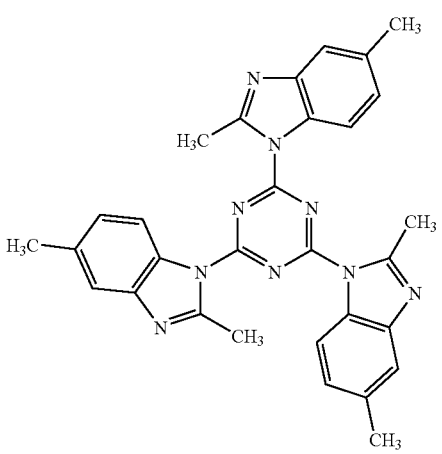
A-27
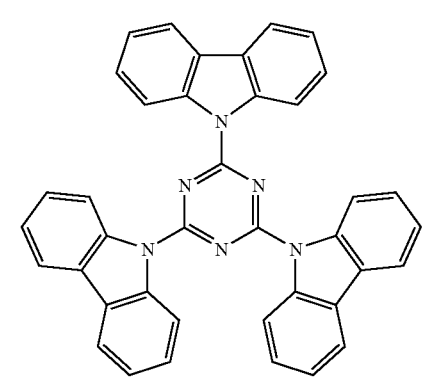
A-28
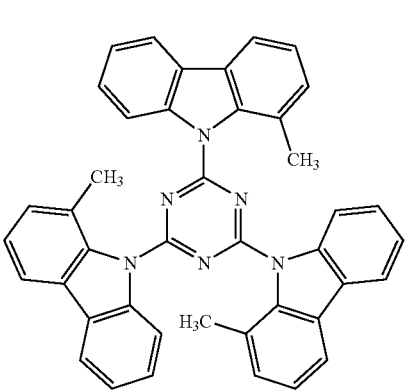
A-29

-continued
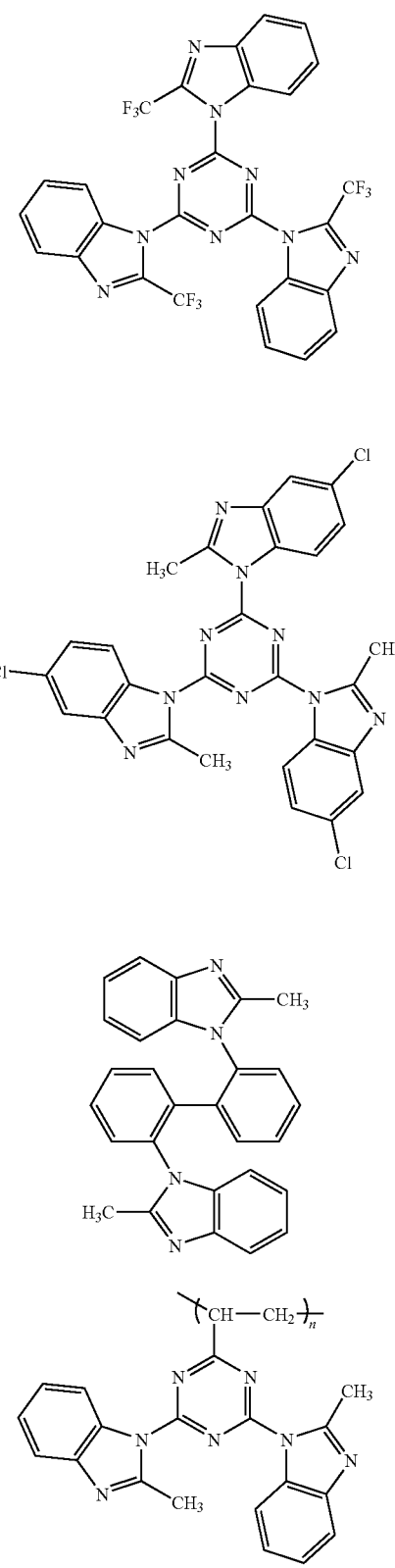
A-30
A-31
A-32
A-33
Weight average molecular weight (as reduced into polystyrene): 14,100
-continued
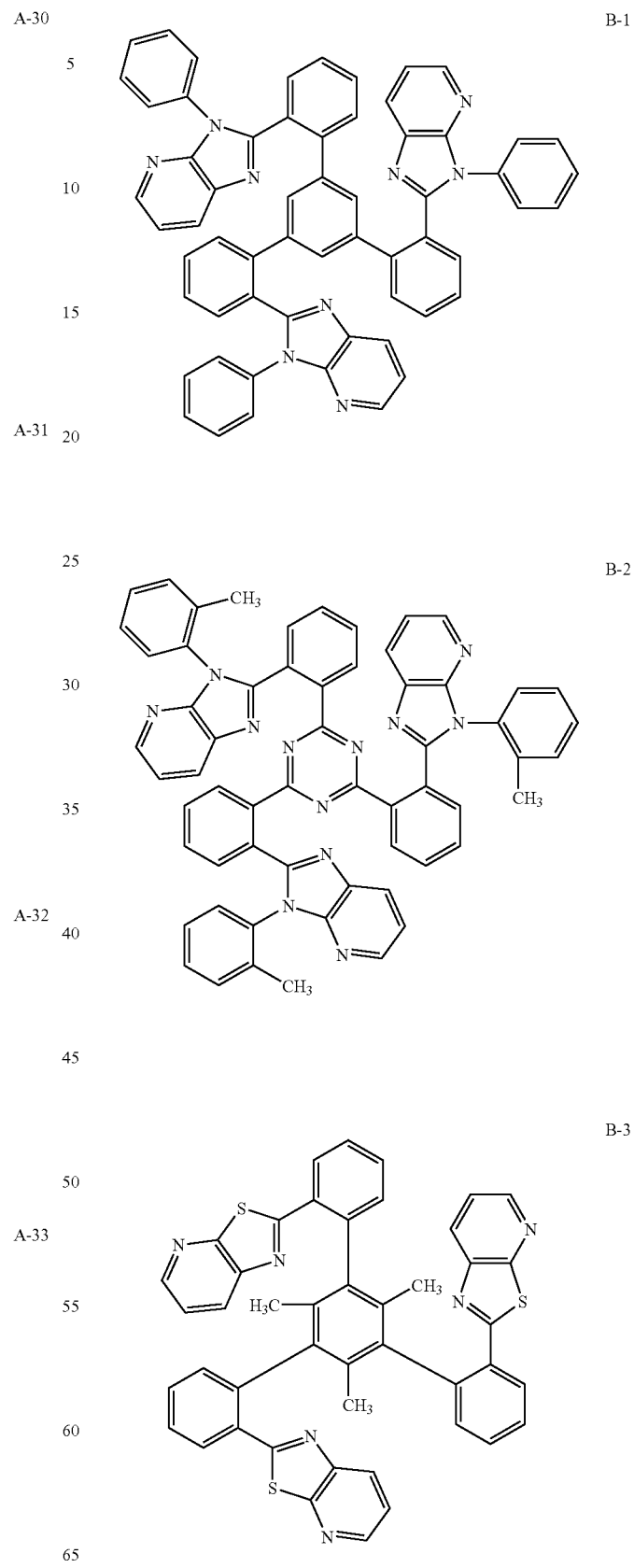
B-1
B-2
B-3

-continued
B-4
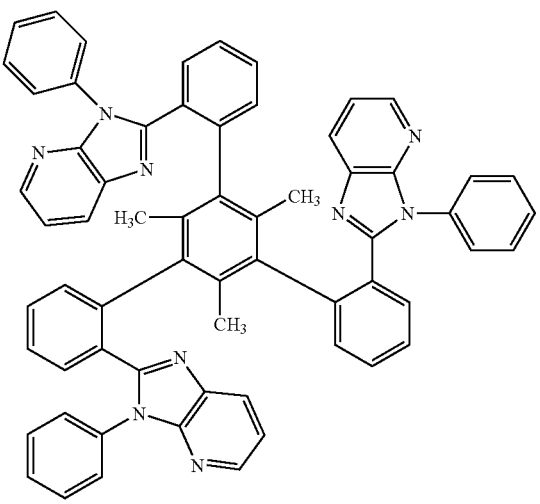
B-5
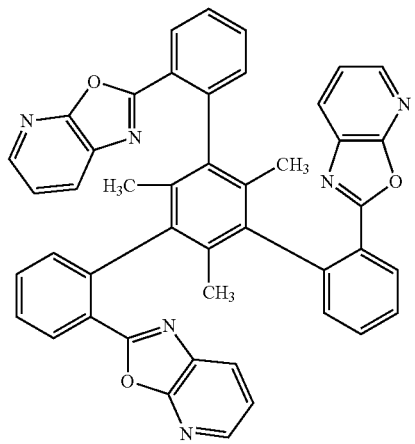
B-6
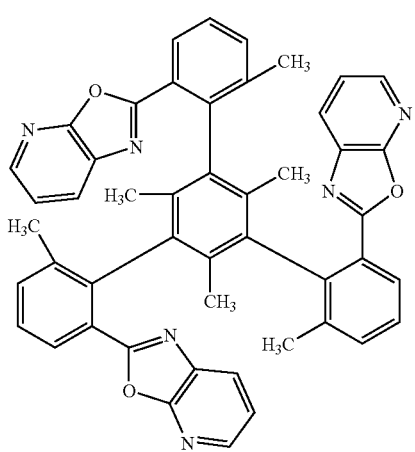
B-7
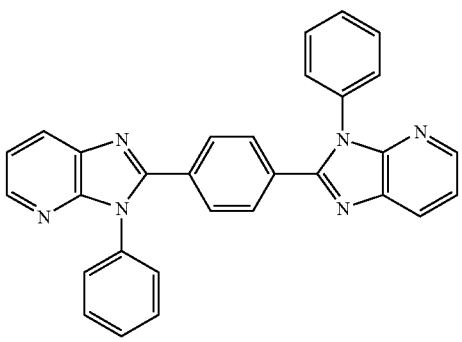
B-8
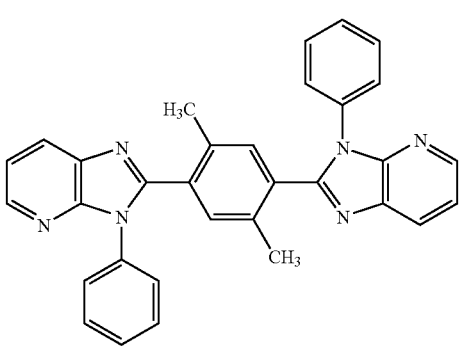
B-9
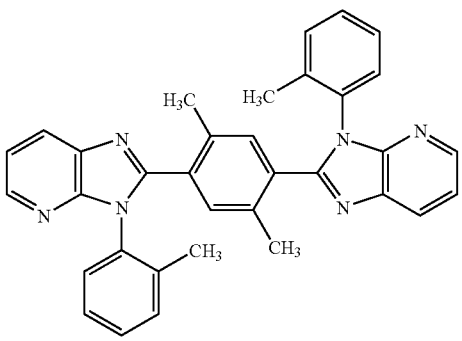
B-10
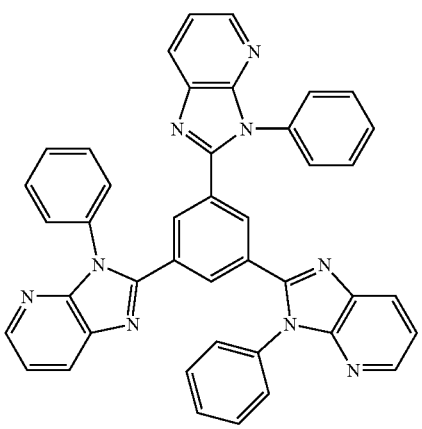

-continued
B-11
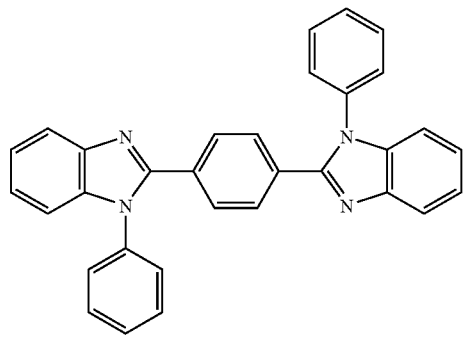
B-12
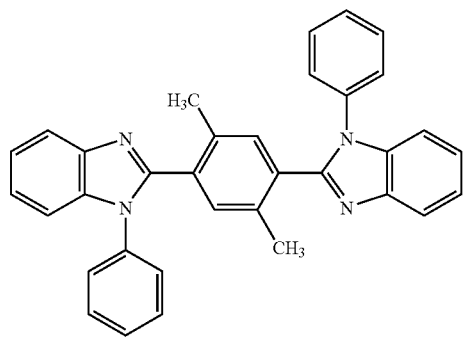
B-13
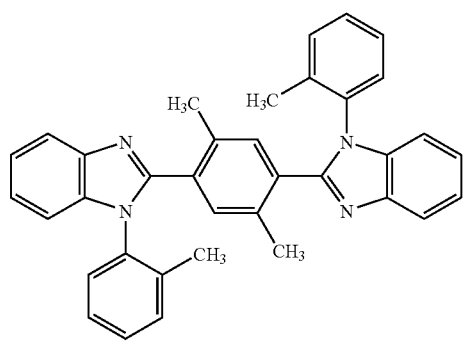
B-14
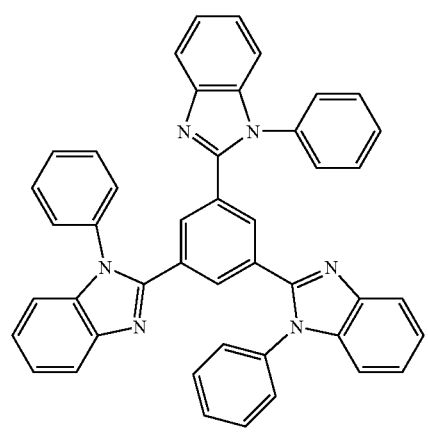
-continued
B-15
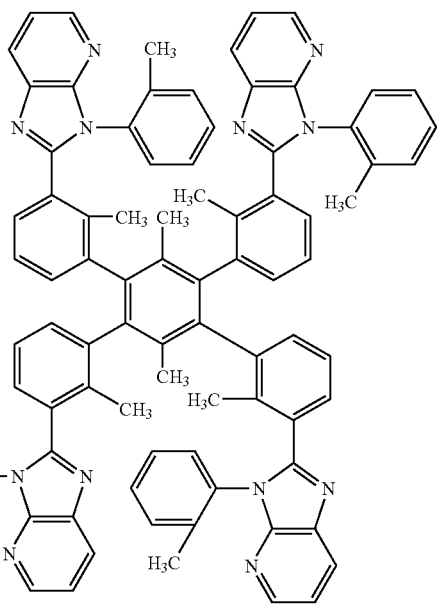
B-16
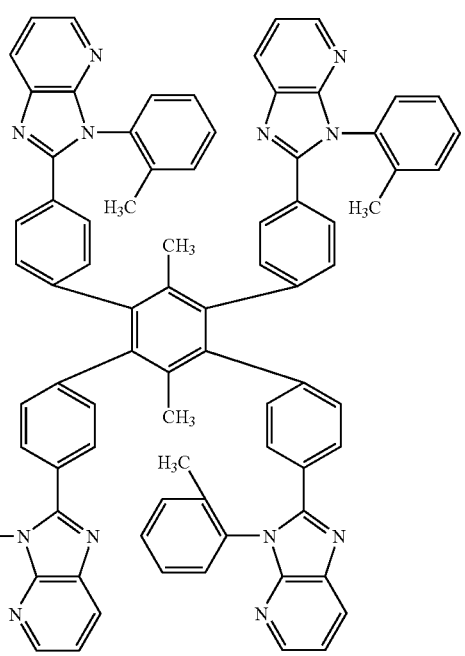

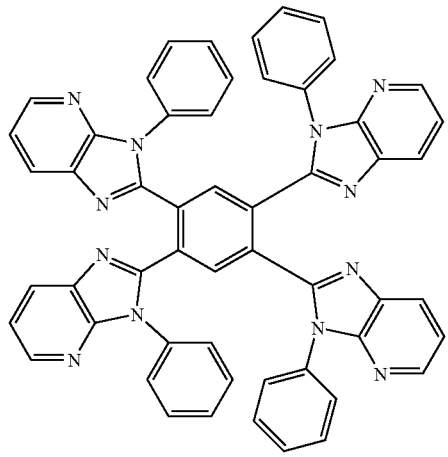
B-17
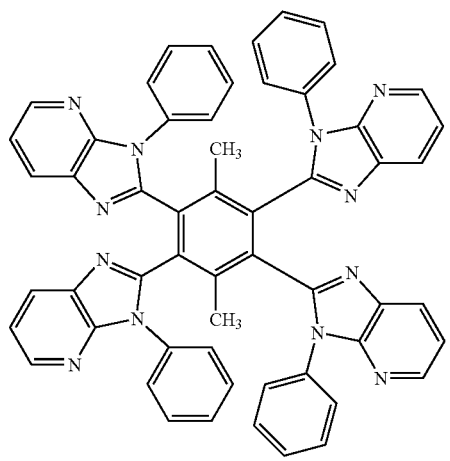
B-20
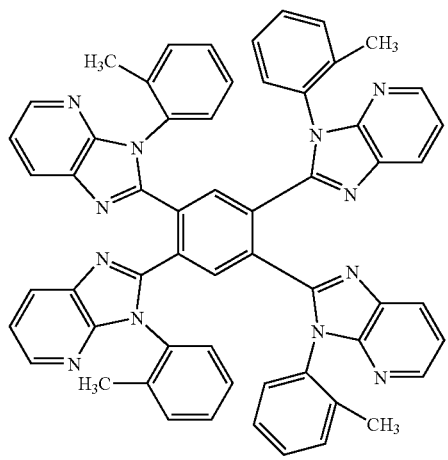
B-18
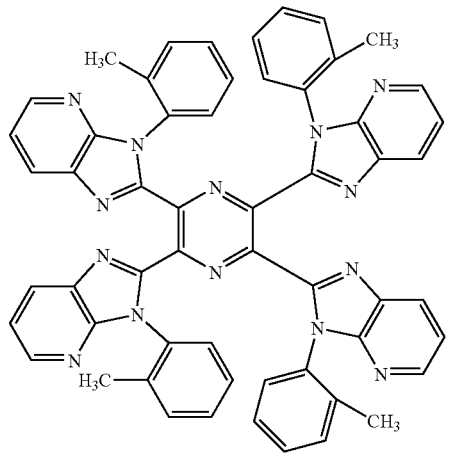
B-21
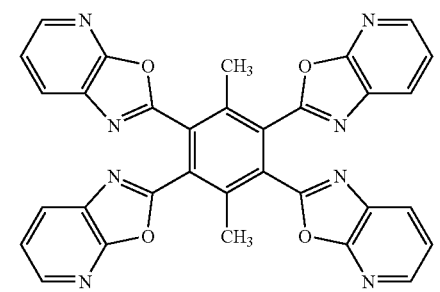
B-19
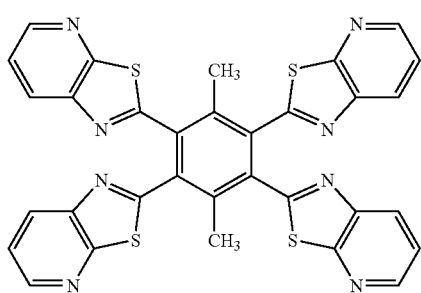
B-22

-continued
B-23
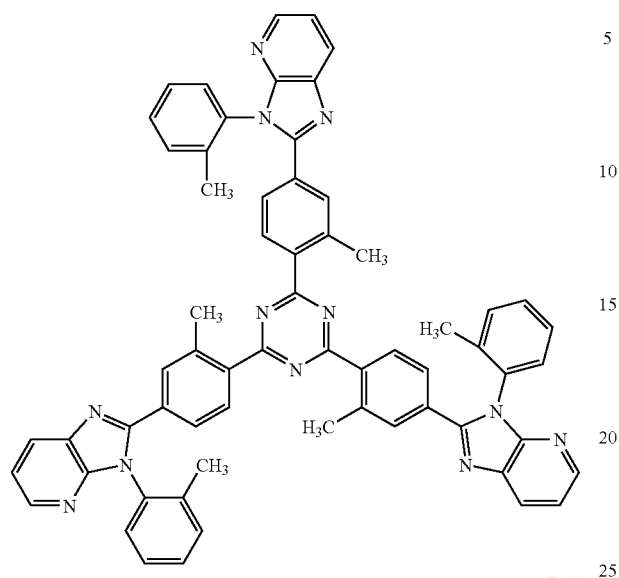
B-24
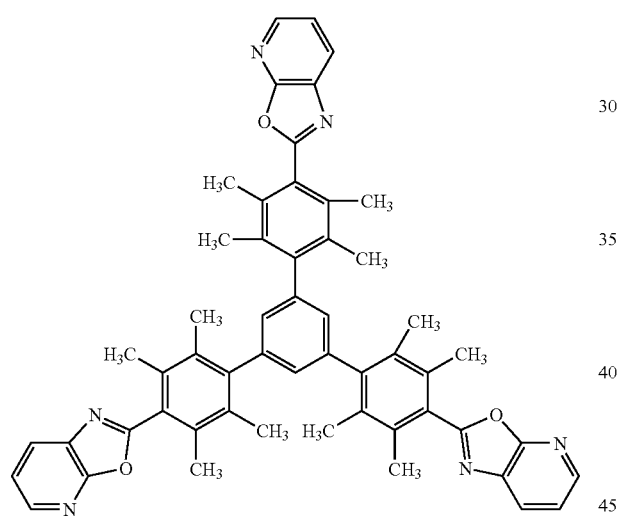
B-25
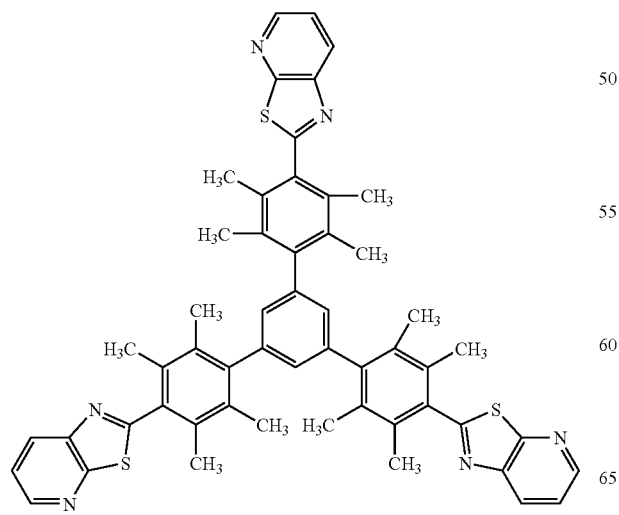
-continued
B-26
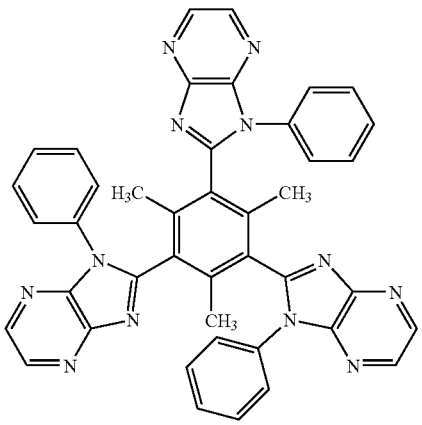
B-27
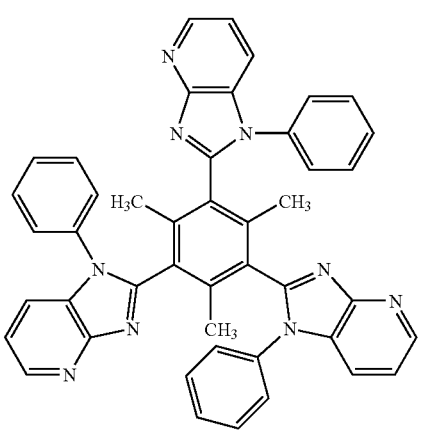
B-28
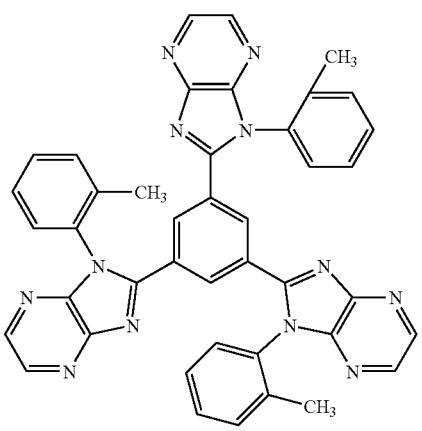

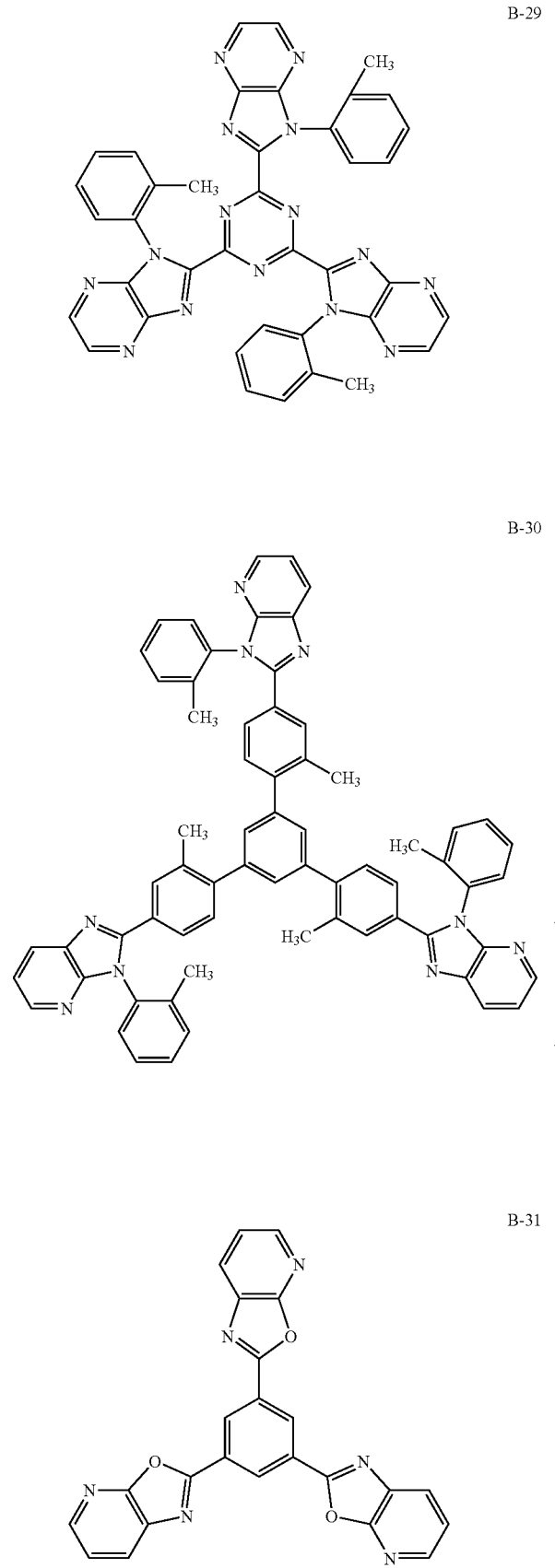
B-29
B-30
B-31
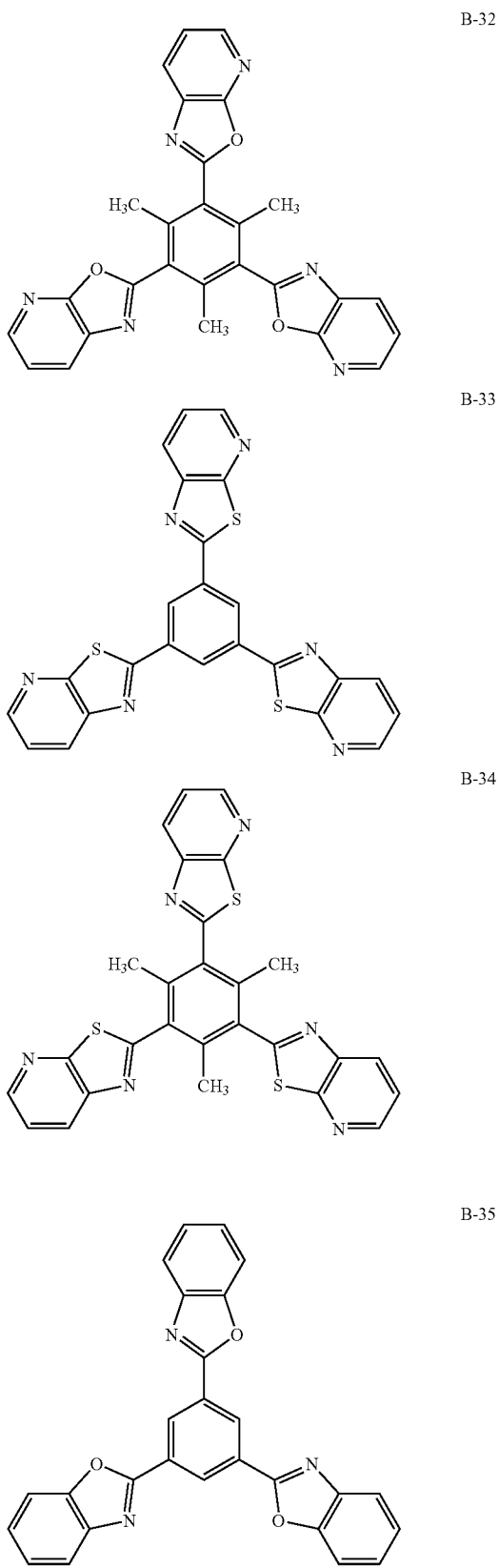
B-32
B-33
B-34
B-35

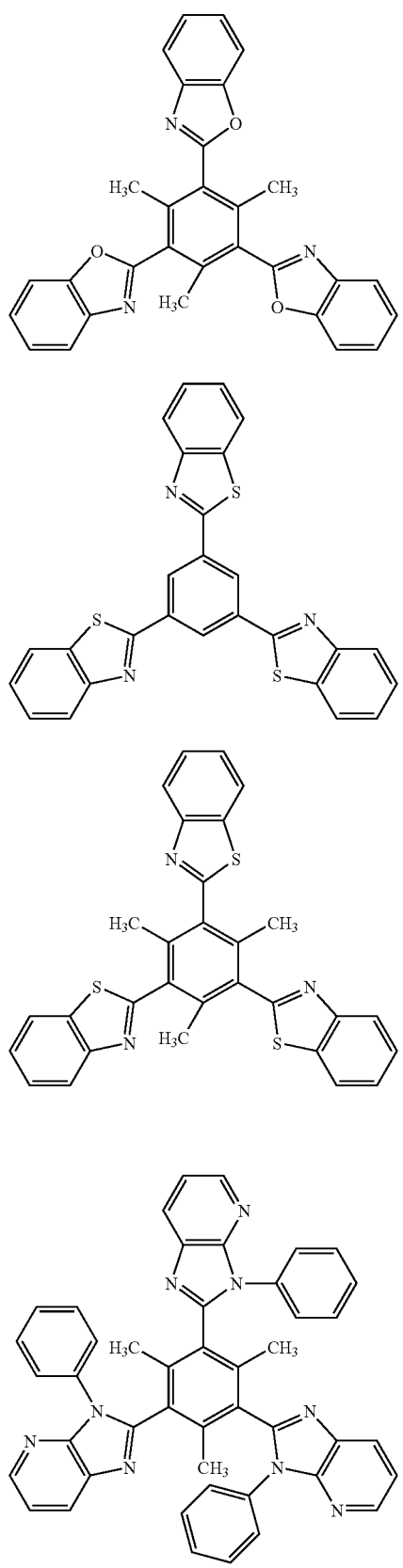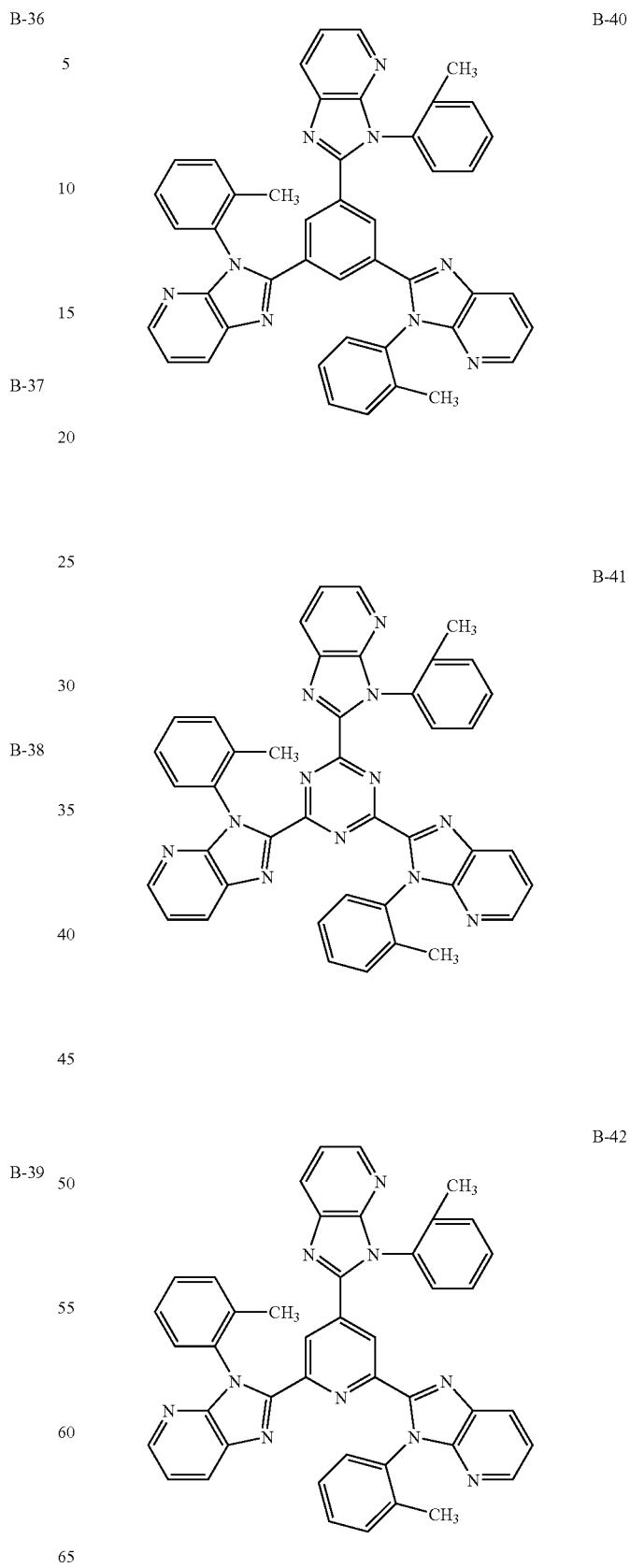

-continued
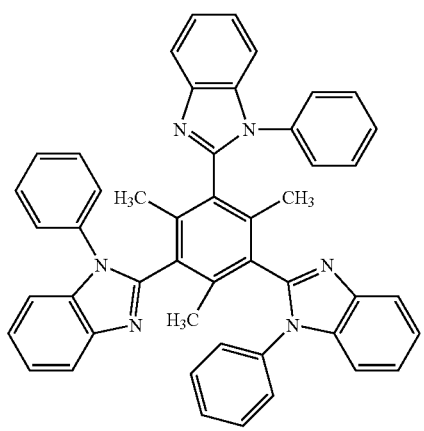
B-43
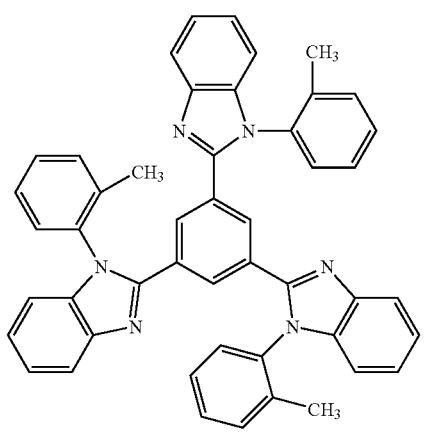
B-44
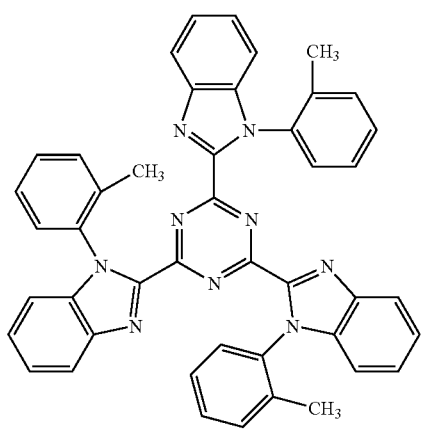
B-45
-continued
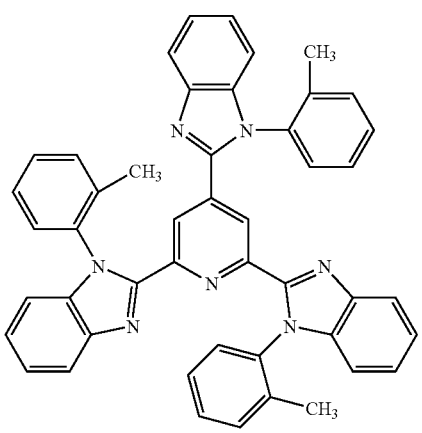
B-46
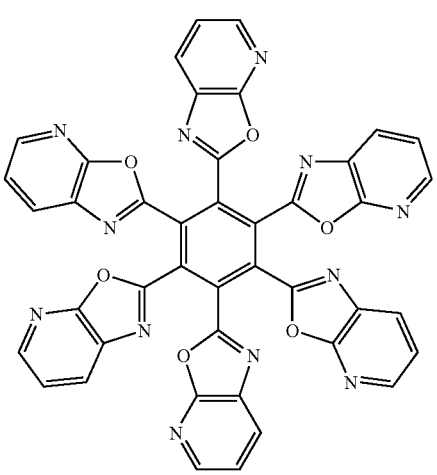
B-47
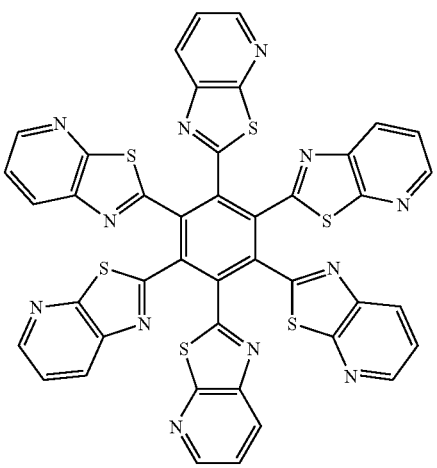
B-48

-continued
B-49
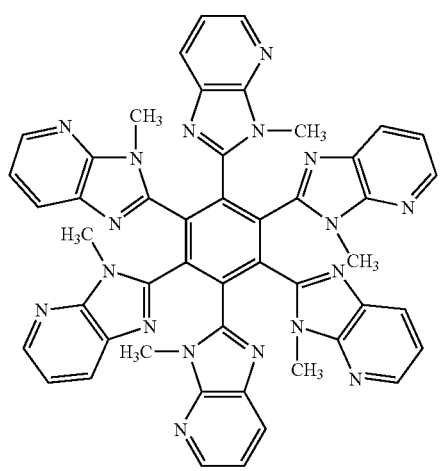
B-50
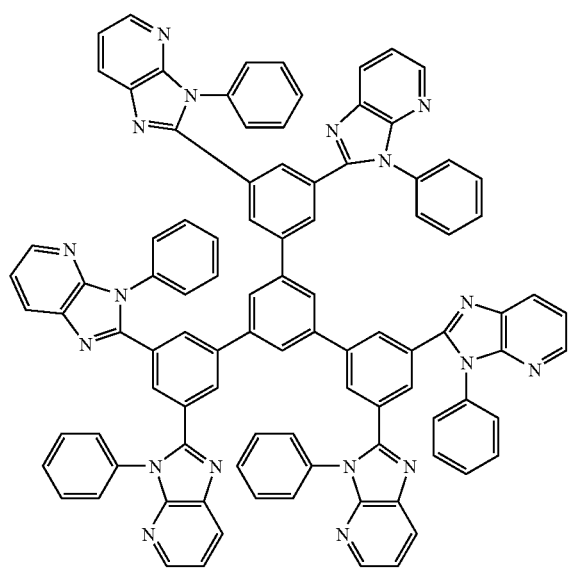
B-51
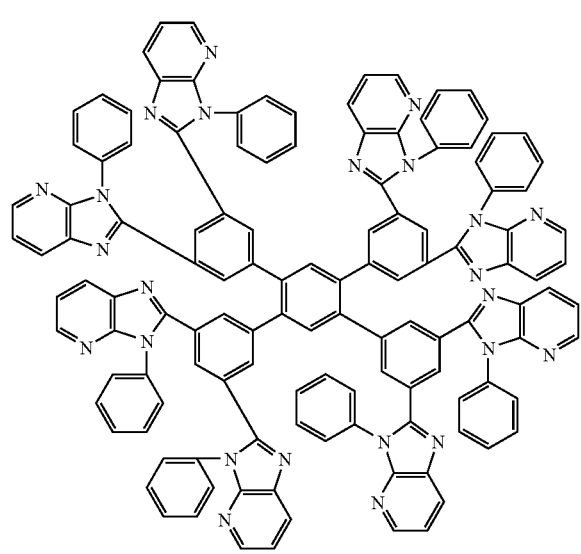
-continued
B-52
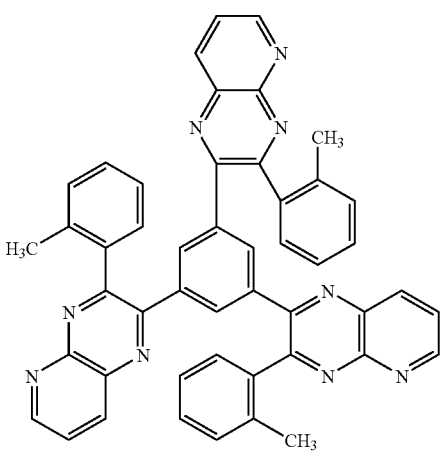
B-53
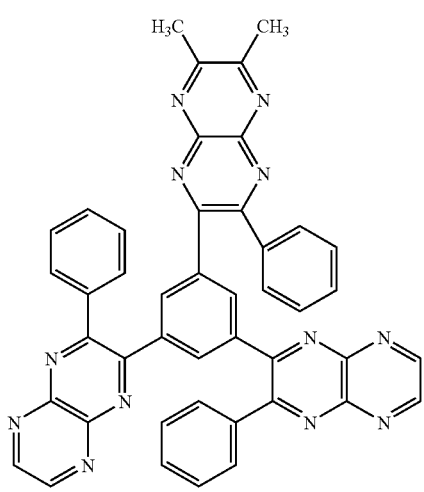
B-54
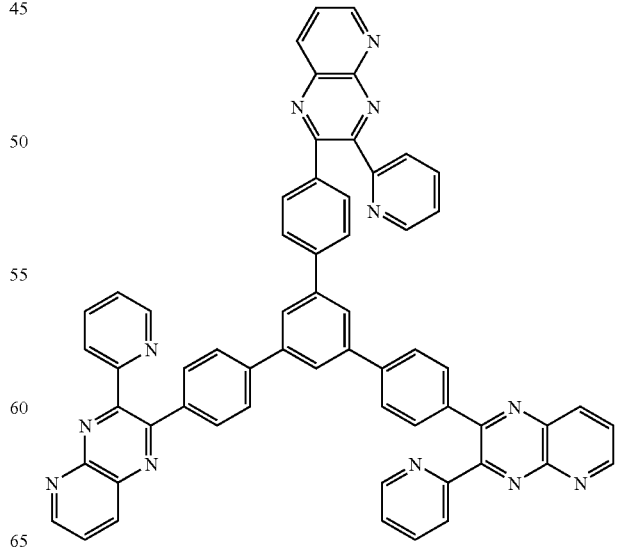

-continued

B-55
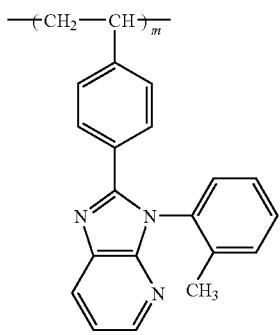
Weight average molecular weight (as reduced into polystyrene): 21,000

B-56
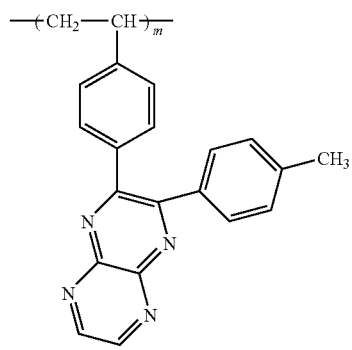
Weight average molecular weight (as reduced into polystyrene): 14,000

B-57
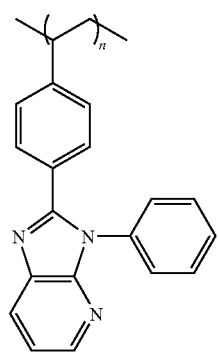
Weight average molecular weight (as reduced into polystyrene): 84,000

B-58
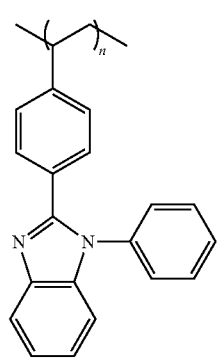
Weight average molecular weight (as reduced into polystyrene): 100,000

-continued

B-59
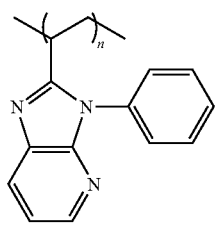
Weight average molecular weight (as reduced into polystyrene): 71,000

B-60
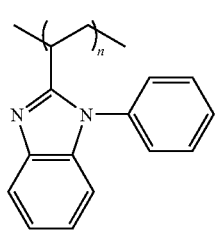
Weight average molecular weight (as reduced into polystyrene): 14,000

B-61
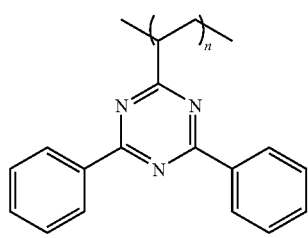
Weight average molecular weight (as reduced into polystyrene): 32,000

B-62

Weight average molecular weight (as reduced into polystyrene): 110,000

B-63

Weight average molecular weight (as reduced into polystyrene): 35,000

-continued
B-64
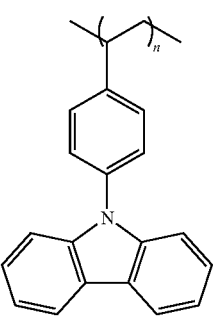
Weight average molecular weight
(as reduced into polystyrene): 26,000
B-65
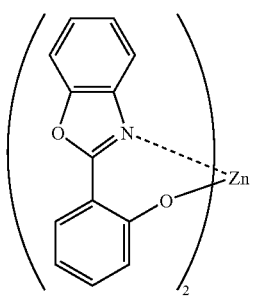
B-66
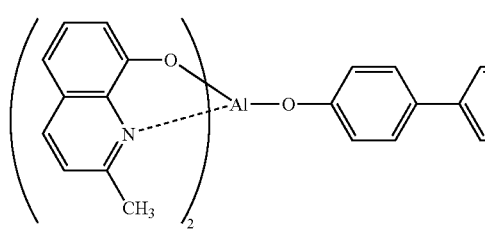
B-67
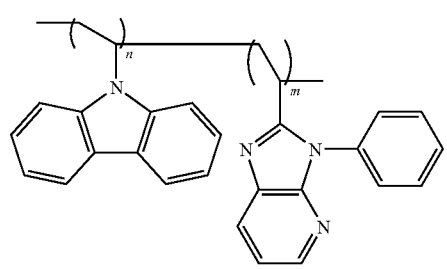
Weight average molecular weight
(as reduced into polystyrene): 15,000, n/m = 7/8
B-68
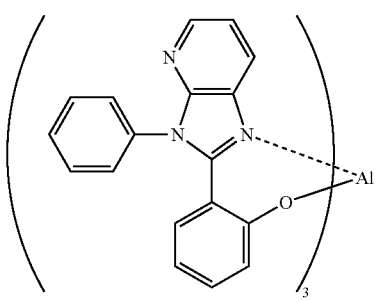
-continued
B-69
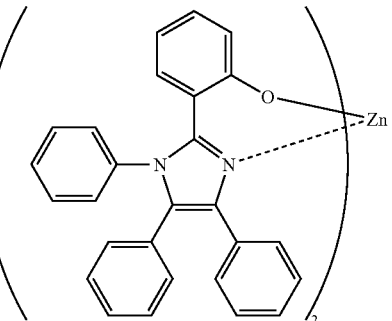
B-70
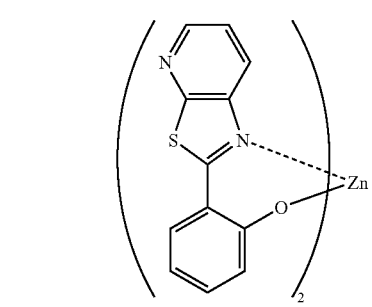
C-1
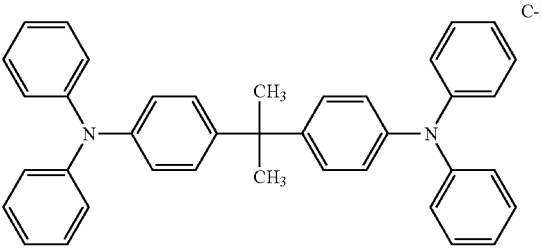
C-2
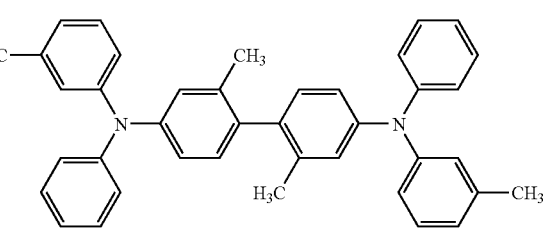
C-3
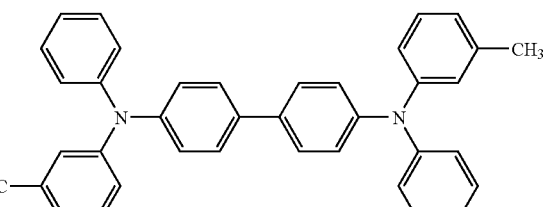
C-4
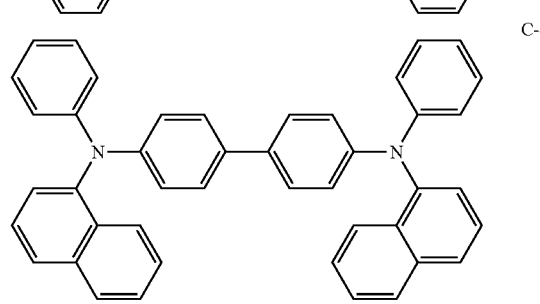

-continued

C-5
C-6
C-7
C-8
C-9
C-10
C-11
C-12
C-13
C-14
C-15

-continued

C-16

C-17

C-18

C-19

C-20

-continued

C-21

C-22

C-23

-continued

C-24

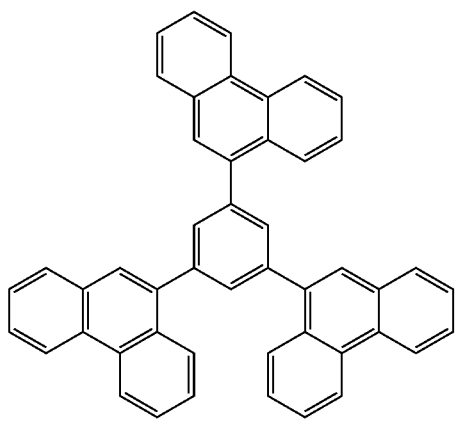

(EL Device of the Invention)

The EL device of the invention will be described below. The EL device of the invention is not particularly limited with respect to the system, driving method, and utilization embodiment.

The formation method of the organic compound layer of the EL device of the invention is not particularly limited. Examples include a resistance heating vapor deposition method, an electron beam method, a sputtering method, a molecular lamination method, a coating method (such as spray coating, dip coating, impregnation, roll coating, gravure coating, reverse coating, roll brush coating, air knife coating, curtain coating, spin coating, flow coating, bar coating, micro-gravure coating, air doctor coating, blade coating, squeeze coating, transfer roll coating, kiss coating, cast coating, extrusion coating, wire bar coating, and screen coating), an inkjet method, a printing method, and a transfer method. Above all, taking into consideration characteristics and manufacture, a resistance heating vapor deposition method, a coating method, and a transfer method are preferable.

The EL device of the invention is a device in which a luminescent layer or plural organic compound films containing a luminescent layer are formed between a pair of electrodes of an anode and a cathode. The EL device of the invention may have a hole injection layer, a hole transport layer, an electron injection layer, an electron transport layer, and a protective layer in addition to the luminescent layer. Also, each of these layers may have other function at the same time. In forming the respective layers, various materials can be used.

The EL device of the invention can improve light extraction efficiency with various, publicly known measures. It is possible to enhance external quantum efficiency by improving light extraction efficiency, for example, by the following measures; processing the surface configuration of the support (for example, formation of fine concavo-convex patterns), control of the refractive indices of the support, the ITO layer and the organic layers, regulation of the thicknesses of the support, the ITO layer and the organic layers, etc.

The EL device of the invention may be of so-called top emission type in which the emitted light is taken out from the cathode side.

The support material used for the EL device of the invention are not specifically restricted, and include inorganic materials such as zirconia-stabilized yttrium, glass, etc., macro-molecular weight materials such as polyesters exemplified by poly (ethylene terephthalate), poly(butylene terephthalate), poly(ethylene naphthalate), etc., polyethylene, polycarbonate, polyether sulfone, polyallylate, allyl diglycol carbonate, polyimide, polycyclo-olefin norbornene resin, poly(chlorotrifluoroethylene), teflon, polytetrafluoroethylene-polyethylene copolymer, etc.

The organic electroluminescent device of the invention may use a blue electroluminescent device based on singlet exciton in combination.

The luminescent layer of the organic electroluminescent device in accordance with the invention may include at least one stacked layer structure of an electron transport compound and a hole transport compound. Among the luminescent layers, there may be present another type of layer structure. The number of the stacked layers may be preferably from 2 to 50, more preferably from 4 to 30, and still more preferably from 6 to 20.

The thickness of each layer constituting the stacked layer structure is not specifically limited, and is preferably from 0.2 nm to 20 nm, more preferably from 0.4 nm to 15 nm, still more preferably from 0.5 nm to 10 nm, and especially preferably from 1 nm to 5 nm.

In the luminescent layer in the organic electroluminescent device of the invention, each of an electron transport compound and a hole transport compound may have a plurality of domain structures. The luminescent layer may further contain another type of domain structure. The size of such individual domains is preferably from 0.2 nm to 10 nm, more preferably from 0.3 nm to 5 nm, still more preferably from 0.5 nm to 3 nm, and especially preferably from 0.7 nm to 2 nm.

The anode feeds holes into the hole injection layer, the hole transport layer, the luminescent layer, etc. As the anode, metals, alloys, metal oxides, electroconductive compounds, or mixtures thereof can be used. Of these, materials having a work function of 4 eV or more are preferable. Specific examples include conductive metal oxides such as tin oxide, zinc oxide, indium oxide, and indium-tin oxide (ITO); metals such as gold, silver, chromium, and nickel; mixtures or laminates of the foregoing metals and conductive metal oxides; inorganic conductive substances such as copper iodide and copper sulfide; organic conductive materials such as polyaniline, polythiophene, and polypyrrole; and mixtures or laminates thereof with ITO. Of these, conductive metal oxides are preferable, and ITO is especially preferable from the viewpoints of productivity, high conductivity, and transparency. Though the film thickness of the anode can be properly chosen according to the material, in general, it is preferably in the range of from 10 nm to 5 μm, more preferably from 50 nm to 1 μm, and further preferably from 100 nm to 500 nm.

As the anode, a layer formed on a substrate such as a soda lime glass, an alkali-free glass, and a transparent resin is used. In the case of using a glass, with respect to the material quality, it is preferable to use an alkali-free glass for the sake of reducing ions eluted from the glass. Also, in the case of using a soda lime glass, it is preferable to use one on which a barrier coat such as silica is provided. The thickness of the substrate is not particularly limited so far as it is sufficient for keeping a mechanical strength. In the case of using a glass, in general, ones having a thickness of 0.2 mm or more, and preferably 0.7 mm or more are used.

For preparation of the anode, various methods can be employed according to the material. For example, in the case of ITO, the film formation is carried out by an electron beam method, a sputtering method, a resistance heating vapor deposition method, a chemical reaction method (such as a sol-gel method), coating of indium-tin oxide dispersion, etc.

In the anode, it is possible to lower the driving voltage of the device and enhance luminous efficiency by rinsing or other treatment. For example, in the case of ITO, UV-ozone treatment, plasma treatment, etc. are effective.

The cathode feeds electrons into the electron injection layer, the electron transport layer, the luminescent layer, etc. and is chosen taking into consideration adhesiveness to an adjacent layer to the cathode, such as the electron injection layer, the electron transport layer, and the luminescent layer, ionization potential, stability, etc. As materials of the cathode, metals, alloys, metal halides, metal oxides, electroconductive compounds, or mixtures thereof can be employed. Specific examples include alkali metals (such as Li, Na, and K) or fluorides thereof, alkaline earth metals (such as Mg and Ca) or fluorides thereof, gold, silver, lead, aluminum, a sodium-potassium alloy or mixed metals thereof, a lithium-aluminum alloy or mixed metals thereof, a magnesium-silver alloy or mixed metals thereof, and rare earth metals such as indium and ytterbium. Of these, materials having a work function of not more than 4 eV are preferable; and aluminum, a lithium-aluminum alloy or mixed metals thereof, and a magnesium-silver ally or mixed metals thereof are more preferable. The cathode can also take a laminate structure containing the foregoing compounds or mixtures in addition of the single layer structure of the foregoing compounds or mixtures. For example, a laminate structure such as aluminum/lithium fluoride and aluminum/lithium oxide is preferable. Though the film thickness of the cathode can be properly chosen according to the material, in general, it is preferably in the range of from 10 nm to 5 µm, more preferably from 50 nm to 1 µm, and further preferably from 100 nm to 1 µm.

For forming the cathode, an electron beam method, a sputtering method, a resistance heating vapor deposition method, a coating method, a transfer method, etc. can be employed. A single metal can be vapor deposited, or two or more components can be vapor deposited at the same time. Further, it is possible to subject plural metals to vapor deposition at the same time to form an alloy electrode. Also, an alloy having been prepared in advance may be vapor deposited. It is preferable that the sheet resistance of the anode and cathode is low, and it is preferably less than several hundreds Ω/□ (Ω/square).

As the material of the luminescent layer, any materials capable of forming a layer having a function such that not only holes from the anode or the hole injection layer or hole transport layer can be injected, but also electrons from the cathode or the electron injection layer or electron transport layer can be injected upon application of an electric field, having a function to transfer the injected charges, or having a function capable of providing a field of recombination of holes and electrons to cause light emission can be employed. Examples of materials other than the compounds of the invention include benzoxazole, benzoimidazole, benzothiazole, styrylbenzene, polyphenyl, diphenylbutadiene, tetraphenylbutadiene, naphthalimide, coumarin, perylene, perinone, oxadiazole, aldazine, pyrralizine, cyclopentadiene, bis-styrylanthracene, quinacridone, pyrropyridine, thiadiazolopyridine, cyclopentadiene, styrylamine, aromatic dimethylidene compounds, various metal complexes represented by 8-quinolinol metal complexes or rare earth complexes, polymer compounds (such as polythiophene, polyphenylene, and polyphenyelenevinylene), organic silanes, iridium tris-phenylpyridine complexes, transition metal complexes capable of emitting phosphorescence represented by platinum porphyrin complexes, and derivatives thereof. Though the film thickness of the luminescent layer is not particularly limited, in general it is preferably in the range of from 1 nm to 5 µm, more preferably from 5 nm to 1 µm, and further preferably from 10 nm to 500 nm.

The formation method of the luminescent layer is not particularly limited. Examples include a resistance heating vapor deposition method, an electron beam method, a sputtering method, a molecular lamination method, a coating method, an inkjet method, a printing method, an LB method, and a transfer method. Of these methods, a resistance heating vapor deposition method and a coating method are preferable.

The luminescent layer may be a single layer or a plurality of layers, and the respective layers cause light emission at a luminescence different from each other. For example, a white luminescence may be caused. A white luminescence may be emitted from the single luminescent layer.

As materials of the hole injection layer and hole transport layer, any materials having any one of a function to inject holes from an anode, a function to transport holes, or a function to obstruct electrons injected from a cathode are employable. Specific examples include carbazoles, triazoles, oxazoles, oxadiazoles, imidazoles, polyarylalkanes, pyrazoline, pyrazolone, phenylenediamine, arylamines, amino-substituted chalcone, styrylanthracene, fluorenones, hydrazones, stilbene, silazanes, aromatic tertiary amine compounds, styrylamine compounds, aromatic dimethylidene based compounds, porphyrin based compounds, conductive high-molecular oligomers such as polysilane based compounds, poly-N-vinylcarbazole, aniline based copolymers, thiophene oligomers, and polythiophenes, organic silanes, carbon films, compounds of the inventions, and derivatives of the foregoing compounds. Though the film thickness of the hole injection layer and hole transport layer is not particularly limited, in general, it is preferably in the range of from 1 nm to 5 µm, more preferably in the range of from 5 nm to 1 µm, and further preferably in the range of from 10 nm to 500 nm. Each of the hole injection layer and the hole transport layer may be of a single layer structure made of one or two or more kinds of the foregoing materials, or may be of a multilayered structure comprising a plurality of layers of the same formulation or a different formation from each other.

Examples of the formation method of the hole injection layer and the hole transport layer include a vacuum deposition method, an LB method, a method of coating a solution or dispersion of the foregoing hole injection/transport material in a solvent, an inkjet method, a printing method, and a transfer method. In the case of the coating method, the hole injection/transport material can be dissolved or dispersed together with a resin component. Examples of the resin component include polyvinyl chloride, polycarbonate, polystyrene, polymethyl methacrylate, polybutyl methacrylate, polyesters, polysulfone, polyphenylene oxide, polybutadiene, poly(N-vinylcarbazole), hydrocarbon resins, ketone resins, phenoxy resins, polyamides, ethyl cellulose, polyvinyl acetate, ABS resins, polyurethanes, melamine resins, unsaturated polyester resins, alkyd resins, epoxy resins, and silicone resins.

As materials of the electron injection layer and electron transport layer, any materials having any one of a function to inject electrons from a cathode, a function to transport electrons, or a function to obstruct electrons injected from an anode are employable. Specific examples include triazines, oxazoles, oxadiazoles, imidazoles, fluorenones, anthraquinodimethane, anthrone, diphenylquinone, thiopyran dioxide, carbodimide, fluorenylidenemethane, distyrylpyrazine, naphthalene, aromatic ring tetracarboxylic acid anhydrides such as perylene, metal complexes represented by metal complexes such as phthacyanine and 8-quinolinol derivatives and metal complexes comprising metal phthalocyanine, benzoxazole or benzothiazole as a ligand, organic silanes, and derivatives of the foregoing compounds. Though the film thickness of the electron injection layer and the electron transport layer is not particularly limited, in general, it is preferably in the range of from 1 nm to 5 μm, more preferably in the range of from 5 nm to 1 μm, and further preferably in the range of from 10 nm to 500 nm. Each of the electron injection layer and the electron transport layer may be of a single layer structure made of one or two or more kinds of the foregoing materials, or may be of a multilayered structure comprising a plurality of layers of the same formulation or a different formation from each other.

Examples of the formation method of the electron injection layer and the electron transport layer include a vacuum deposition method, an LB method, a method of coating a solution or dispersion of the foregoing electron injection/transport material in a solvent, an inkjet method, a printing method, and a transfer method. In the case of the coating method, the electron injection/transport material can be dissolved or dispersed together with a resin component. Examples of the resin component include those enumerated above for the hole injection/transport layer.

As materials of the protective layer, any materials having a function to retard the matter that substances of likely promoting degradation of the device, such as water and oxygen, enter the device are employable. Specific examples include metals (such as In, Sn, Pb, Au, Cu, Ag, Al, Ti, and Ni), metal oxides (such as MgO, SiO, $SiO_2$, $Al_2O_3$, GeO, NiO, CaO, BaO, $Fe_2O_3$, $Y_2O_3$, and $TiO_2$), metal fluorides (such as $MgF_2$, LiF, $AlF_3$, and $CaF_2$), nitrides (such as $SiN_x$ and $SiO_xN_y$), polyethylene, polypropylene, polymethyl methacrylate, polyimides, polyureas, polytetrafluoroethylene, polychlorotrifluoroethylene, polydichlorodifluoroethylene, a copolymer of chlorotrifluoroethylene and dichlorodifluoroethylene, copolymers obtained by copolymerizing a monomer mixture of ethylene and at least one comonomer, fluorine-containing copolymers having a cyclic structure in the copolymerization main chain, water absorbing substances having a coefficient of water absorption of 1% or more, and moisture-proofing substances having a coefficient of water absorption of not more than 0.1%.

The formation method of the protective layer is not particularly limited. Examples include a vacuum vapor deposition method, a sputtering method, a reactive sputtering method, an MBE (molecular beam epitaxy) method, a cluster ion beam method, an ion plating method, a plasma polymerization method (high-frequency ion plating method), a plasma CVD method, a laser CVD method, a heat CVD method, a gas source CVD method, a coating method, a printing method, and a transfer method.

EXAMPLES

The invention will be described below in more detail with reference to the Examples, but it should not be construed that the invention is limited thereto.

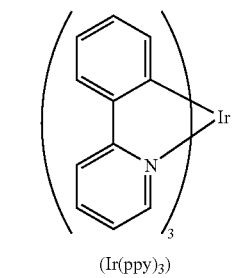

(Ir(ppy)₃)

G-1

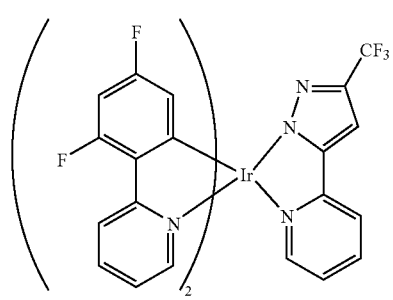

G-2

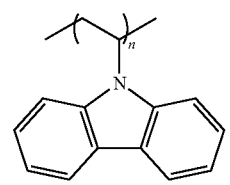

PVK

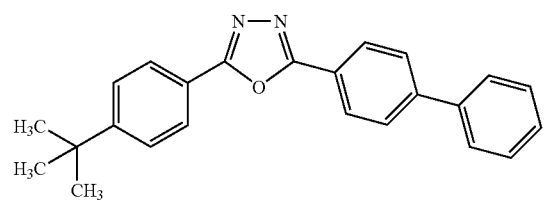

PBD

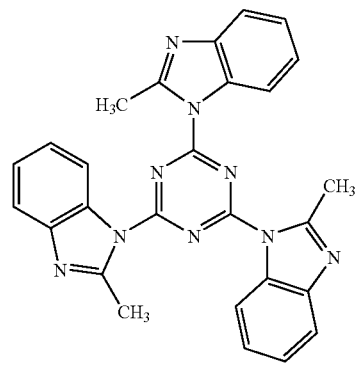

(A-19)

ET-1

-continued

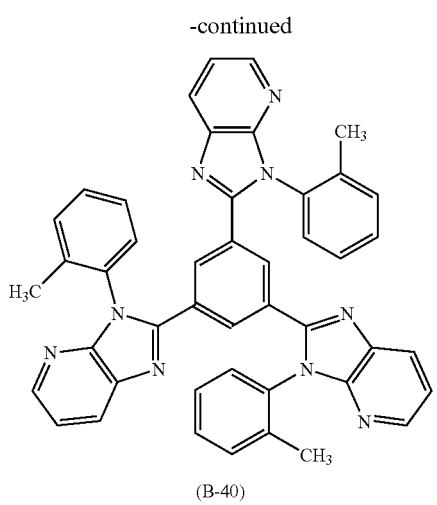

(B-40)

ET-2

Example 1

A glass substrate having a size of 25 mm×25 mm×0.7 mm, on which ITO is subjected to film formation in a thickness of 150 nm (manufactured by Tokyo Sanyo Vacuum Co., Ltd.) is used as a transparent supporting substrate. This transparent supporting substrate is etched and rinsed. On this ITO glass substrate, Baytron P (a PEDOT-PSS (polyethylenedioxythiophene-polystyrenesulfonic acid doped material) dispersion, manufactured by Bayer AG) is spin coated and then dried in vacuo at 100° C. for one hour, thereby providing a hole transport layer (film thickness: about 100 nm). Forty milligrams of poly-N-vinylcarbazole (PVK) as a hole transport compound, 1 mg of a phosphorescent compound G-1 $(Ir(ppy)_3)$, and 6 mg of an electron transport compound ET-1 are dissolved in 3.8 g of chloroform, and the solution is spin coated on the forgoing substrate (film thickness: about 50 to 70 nm), followed by drying in vacuo at 100° C. for 30 minutes. The resulting substrate is subjected to vapor deposition with an electron transport material ET-2 and LiF in that order in a film thickness of about 36 nm and about 1 nm, respectively under vacuum of $10^{-3}$ to $10^{-4}$ Pa under the condition at the substrate temperature of room temperature. A patterned mask (luminescent area: 5 mm×4 mm) is placed thereon and subjected to vapor deposition with aluminum in a film thickness of about 200 nm, to prepare a device. Incidentally, the thus prepared device is sealed within a dry glove box.

Example 2

A device is prepared in the same manner as in Example 1, except that in the device of Example 1, the electron transport material ET-1 to be added in the luminescent layer is replaced by ET-2.

Example 3

A device is prepared in the same manner as in Example 1, except that in the device of Example 1, G-1 is replaced by G-2 and that in the electron transport layer to be vapor deposited, ET-2 is replaced by ET-1.

Comparative Example 1

A device is prepared in the same manner as in Example 1, except that in the device of Example 1, the electron transport material ET-1 to be added in the luminescent layer is not added.

Comparative Example 2

A device is prepared in the same manner as in Example 1, except that in the device of Example 1, the electron transport material ET-1 to be added in the luminescent layer is replaced by PBD, and G-1 is replaced by G-2 and that in the electron transport layer to be vapor deposited, ET-2 is replaced by ET-1.

The luminescence wavelength and external quantum efficiency of each of the devices used in the Examples and Comparative Examples are determined. That is, a direct current constant voltage is applied to each device to cause light emission using a source measure unit 2400 manufactured by Toyo Corporation. The luminance is measured using a luminance meter BM-8 manufactured by Topcon Corporation, and the luminescence wavelength and CIE chromaticity coordinate are measured using a spectral analyzer PMA-11 manufactured by Hamamatsu Photonics K.K. The external quantum efficiency is calculated based on the resulting numerical values according to the luminance reduction method. The results obtained are summarized in the following table.

TABLE 1

| | Luminescent layer | | | | | External quantum efficiency (%) | Luminance upon measurement (cd/m$^2$) |
|---|---|---|---|---|---|---|---|
| | Host compound | Guest compound | Electron transport material | Electron transport layer | Luminescence wavelength (nm) | | |
| Example 1 | PVK | G-1 | ET-1 | ET-2 | 515 | 16.8 | 88 |
| Example 2 | PVK | G-1 | ET-2 | ET-2 | 515 | 10.6 | 107 |
| Comparative Example 1 | PVK | G-1 | Nil | ET-2 | 515 | 6.9 | 127 |
| Example 3 | PVK | G-2 | ET-1 | ET-1 | 462 | 9.2 | 94 |
| Comparative Example 2 | PVK | G-2 | PBD | ET-1 | 462 | 1.3 | 109 |

Further, the $T_1$ energy level values of the respective compounds are shown in the following table.

TABLE 2

| Compound | $T_1$ level (kcal/mole) |
|---|---|
| ET-1 | 68 |
| ET-2 | 60 |
| PBD | 55 |
| PVK | 65 |
| G-1 | 60 |
| G-2 | 65 |

Example 4

The device of Example 3 and the device of Comparative Example 1 were each light emitted at 300 cd/m² and measured for luminance half-life. The device of Example 3 had a half-life of about 2 times that of the device of Comparative Example 1.

Example 5

TPD (N,N'-diphenyl-N,N'-di(o-tolyl)benzidine) was vapor deposited in a thickness of 50 nm on an ITO substrate, on which were then vapor deposited jointly A-10 (the compound of the invention, $T_1$=65 kcal/mole) and ET-1 (the compound of the invention) and G-2 (the compound of the invention, $T_1$=65 kcal/mole) in a weight ratio of 65/35 in a thickness of 36 nm. ET-1 (the compound of the invention) was further vapor deposited thereon in a thickness of 36 nm. A cathode was vapor deposited in the same manner as in Example 1, to prepare a device. As a result of evaluation, blue luminescence of ELmax=465 nm was obtained in an external quantum efficiency of 12%.

Example 6

A device was prepared in the same manner as in Example 1, except for using B-68 ($T_1$=60 kcal/mole) in place of ET-1 and using G-1 in place of G-2, and then evaluated. As a result, green luminescence of ELmax=520 nm was obtained in an external quantum efficiency of 18%.

Comparative Example 3

Forty milligrams of PVK, 12 mg of PBD, and 1 mg of G-1 ($T_1$=60 kcal/mole) were dissolved in 2.5 mL of dichloroethane, and the solution was spin coated on an ITO substrate (at 2,000 rpm for 20 seconds). A cathode was vapor deposited in the same manner as in Example 1, to prepare a device. As a result of evaluation, green luminescence of ELmax=515 nm was obtained in an external quantum efficiency of 3%.

Comparative Example 4

A device was prepared using the green luminescent material G-1 in place of a red phosphorescent material (PtOEP) of red EL device as described in Example 3 of JP-A-2002-305085. Copper phthalocyanine was vapor deposited in a thickness of 20 nm on an ITO substrate, on which was then vapor deposited α-NPD (N,N'-diphenyl-N,N'-di(α-naphthyl)-benzidine) in a thickness of 30 nm. Further, BAlq₂ (bis(8-hydroxy-2-methylquinolinato)-biphenyloxy-aluminum complex, $T_1$=not more than 55 kcal/mole), α-NPD (Ip=5.5 eV, $T_1$=not more than 57 kcal/mole), and G-1 were vapor deposited thereon jointly in a weight ratio of 20/80/4. BAlq₂ was further vapor deposited thereon in a thickness of 10 nm, on which was then vapor deposited Alq (tris(8-hydroxyquinolinato) aluminum complex) in a thickness of 40 nm. Thereafter, a cathode was vapor deposited in the same manner as in Example 1, to prepare a device. As a result of evaluation, green luminescence of ELmax=515 nm was obtained in an external quantum efficiency of 6%.

Comparative Example 5

A device was prepared in the same manner as in Comparative Example 4, except for using a blue luminescent material G-2 in place of G-1, and then evaluated. As a result, blue luminescence of ELmax=465 nm was obtained in an external quantum efficiency of 3%.

Comparative Example 6

Copper phthalocyanine was vapor deposited in a thickness of 10 nm on a rinsed ITO substrate, on which NPD was vapor deposited in a thickness of 50 nm. Then, on the NPD layer, was then vapor deposited one of the compounds of the invention, CBP ($T_1$=60 Kcal/mol) and Ir(ppy)₃ ($T_1$=60 Kcal/mol) in a mass ratio of 17:1 in a thickness of 36 nm. Further, on this layer, one of the compounds of the invention, ET-2 ($T_1$=60 Kcal/mol) was vapor deposited in a thickness of 36 nm. Thereafter, a cathode was vapor deposited in the same manner as in Example 1, to prepare a device. As a result of evaluation, green luminescence of ELmax=515 nm was obtained in an external quantum efficiency of 5%.

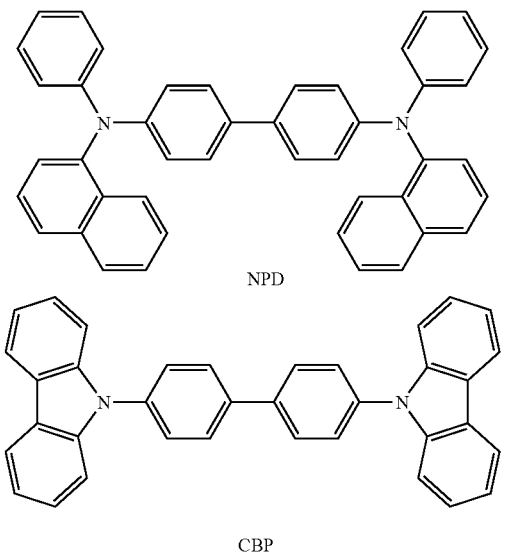

NPD

CBP

Example 7

Instead of CBP, a mixture of compounds of the invention A-28 (an electron injection/transport compound, $T_1$=65 Kcal/mol) and C-12 (a hole injection/transport compound, $T_1$=62 Kcal/mol) in the mass ratio of 1:1 was used for the preparation of a device in the same way as in Comparative Example 6. As a result of the evaluation of the device thus prepared, green light emission originating from Ir(ppy)₃ was obtained at ELmax=515 nm. And an external quantum efficiency of 8% was obtained. The operating durability at 500 cd/m² was evaluated to give a half decay time of about 4 times as long as that of the device in Comparative Example 6.

Example 8

Instead of CBP, a mixture of ET-2 (an electron injection/transport compound) and CBP (a hole injection/transport compound) in the mass ratio of 1:10 was used for the preparation of a device in the same way as in Comparative Example 6. As a result of the evaluation of the device thus prepared, green light emission originating from Ir(ppy)$_3$ was obtained at ELmax=515 nm. And an external quantum efficiency of 7% was obtained. The operating durability at 500 cd/m$^2$ was evaluated to give a half decay time of about 3 times as long as that of the device in Comparative Example 6.

Example 9

Instead of CBP, a mixture of C-18 (an electron injection/transport compound, $T_1$=65 Kcal/mol) and C-12 (a hole injection/transport compound, $T_1$=62 Kcal/mol) in the mass ratio of 1:1 was used for the preparation of a device in the same way as in Comparative Example 6. As a result of the evaluation of the device thus prepared, green light emission originating from Ir(ppy)$_3$ was obtained at ELmax=515 nm. And an external quantum efficiency of 6% was obtained. The operating durability at 500 cd/m$^2$ was evaluated to give a half decay time of about twice as long as that of the device in Comparative Example 6.

Example 10

Instead of CBP, a mixture of C-22 (an electron injection/transport compound, $T_1$=68 Kcal/mol) and C-12 (a hole injection/transport compound, $T_1$=65 Kcal/mol) in the mass ratio of 1:2 was used for the preparation of a device in the same way as in Comparative Example 6. As a result of the evaluation of the device thus prepared, green light emission originating from Ir(ppy)$_3$ was obtained at ELmax=515 nm. And an external quantum efficiency of 7% was obtained. The operating durability at 500 cd/m$^2$ was evaluated to give a half decay time of about 3 times as long as that of the device in Comparative Example 6.

Example 11

On a rinsed ITO support, copper phthalocyanine was vapor deposited in a thickness of 10 nm, on which NPD was vapor deposited in a thickness of 50 nm. On the layer thus prepared, a compound of the invention C-12 (a hole injection/transport compound, $T_1$=62 Kcal/mol) and Ir(ppy)$_3$ at the mass ratio of 17:1 were vapor deposited in a thickness of 1 nm. Thereafter A-28 (an electron injection/transport compound, $T_1$=65 Kcal/mol) and Ir(ppy)$_3$ were vapor deposited at the mass ratio of 17:1 in a thickness of 1 nm. This cycle was repeated 18 times to provide a luminescent layer of about 36 nm thickness. By vapor depositing ET-2 in a thickness of 36 nm on this luminescent layer, a device was prepared in the same manner as in Comparative Example 6. As a result of the evaluation of the device thus obtained, green light emission originating from Ir(ppy)$_3$ was obtained at ELmax=515 nm. And an external quantum efficiency of 8% was obtained. The operating durability at 500 cd/m$^2$ was evaluated to give a half decay time of about 5 times as long as that of the device in Comparative Example 6.

From the foregoing results, it is noted that the devices according to the invention, in which an electron transport material having a high $T_1$ value is added in the luminescent layer, have a high external quantum efficiency as compared with the devices in which PBD is added in the luminescent layer and those in which only two kinds of compounds are contained in the luminescent layer. Also, the devices according to the invention in which the energy level is regulated can realize blue and/or green light emission with high-efficiency luminescence.

According to the invention, it is possible to provide a luminescent device that can realize green or blue light emission, has high luminance and high external quantum efficiency and has excellent durability.

This application is based on Japanese Patent application JP 2002-381014, filed Dec. 27, 2002, and Japanese Patent application JP 2003-409183, filed Dec. 8, 2003, the entire contents of those are hereby incorporated by reference, the same as if set forth at length.

The invention claimed is:

1. An organic electroluminescent device comprising:
a pair of electrodes; and
at least one organic layer between the pair of electrodes, the at least one organic layer including a luminescent layer, wherein the luminescent layer contains at least one electron injection/transport compound, at least one hole injection/transport compound, and at least one green or blue phosphorescent compound; and the electron injection/transport compound and the hole injection/transport compound each has a minimum triplet exciton energy value which is equal to or more than that of the green or blue phosphorescent compound;
wherein the hole injection/transport compound has an ionization potential of from 5.6 eV to 6.1 eV and the electron injection/transport compound has an electron affinity of from 2.0 eV to 3.5 eV; and
wherein the electron injection/transport compound, the hole injection/transport compound and the green or blue phosphorescent compound each has a $T_1$ value of 62 kcal/mole or more.

2. The organic electroluminescent device of claim 1, wherein the green or blue phosphorescent compound is a transition metal complex capable of emitting light via a triplet excitation state.

3. The organic electroluminescent device of claim 1, wherein phosphorescence obtained from the green or blue phosphorescent compound has a λmax of not longer than 500 nm.

4. The organic electroluminescent device of claim 1, wherein the hole injection/transport compound is a substituted or unsubstituted pyrrole compound.

5. The organic electroluminescent device of claim 4, wherein the substituted or unsubstituted pyrrole compound is represented by the formula (1):

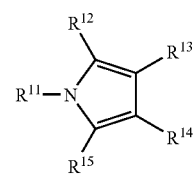

(1)

wherein $R^{11}$ to $R^{15}$ each represents a hydrogen atom or a substituent, and the substituents may be bonded to each other to form a ring structure.

6. The organic electroluminescent device of claim 5, wherein the formula (1) is represented by the formula (3):

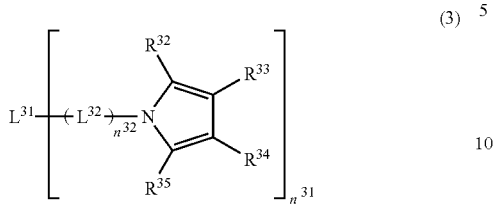

(3)

wherein $R^{32}$ to $R^{35}$ each represents a hydrogen atom or a substituent, and the substituents may be bonded to each other to form a ring structure; $L^{31}$ represents a connecting group; $L^{32}$ represents a di- or more valent connecting group; $n^{31}$ represents an integer of 2 or more; and $n^{32}$ represents an integer of from 0 to 6.

7. The organic electroluminescent device of claim 1, wherein the electron injection/transport compound is a heterocyclic compound containing at least two nitrogen atoms.

8. The organic electroluminescent device of claim 7, wherein the heterocyclic compound containing at least two nitrogen atoms is a compound represented by the formula (2):

(2)

wherein $R^{21}$ represents a hydrogen atom or a substituent; $X^{21}$, $X^{22}$, $X^{23}$, and $X^{24}$ each represents a nitrogen atom or a substituted or unsubstituted carbon atom; and at least one $X^{22}$, $X^{23}$, and $X^{24}$ represents a nitrogen atom.

9. The organic electroluminescent device of claim 8, wherein the formula (2) is represented by the formula (4):

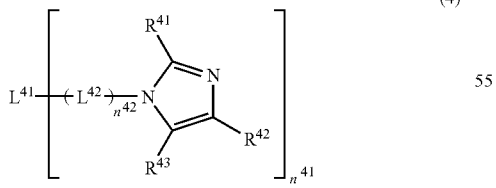

(4)

wherein $R^{41}$, $R^{42}$, and $R^{43}$ each represents a hydrogen atom or a substituent; $L^{41}$ represents a connecting group; $n^{41}$ represents an integer of 2 or more; $L^{42}$ represents a di- or more valent connecting group; and $n^{42}$ represents an integer of from 0 to 6.

10. The organic electroluminescent device of claim 8, wherein the formula (2) is represented by the formula (5):

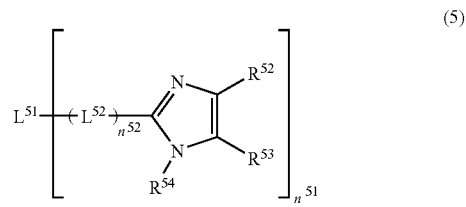

(5)

wherein $R^{52}$, $R^{53}$, and $R^{54}$ each represents a hydrogen atom or a substituent; $L^{51}$ represents a connecting group; $n^{51}$ represents an integer of 2 or more; $L^{52}$ represents a di- or more valent connecting group; and $n^{52}$ represents an integer of from 0 to 6.

11. The organic electroluminescent device of claim 1, wherein at least one of the hole injection/transport compounds contained in the luminescent layer is represented by the following formula (6)

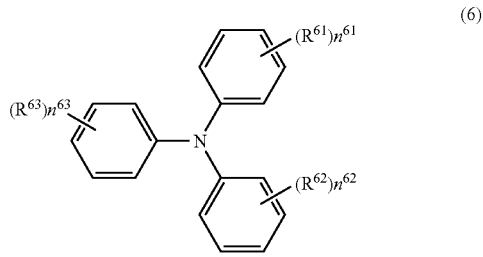

(6)

wherein $R^{61}$, $R^{62}$ and $R^{63}$ each represent a substituent and $n^{61}$ to $n^{63}$ each represent an integer of 0 to 5.

12. The organic electroluminescent device of claim 1, wherein at least one of the hole injection/transport compounds contained in the luminescent layer is represented by the following formula (7)

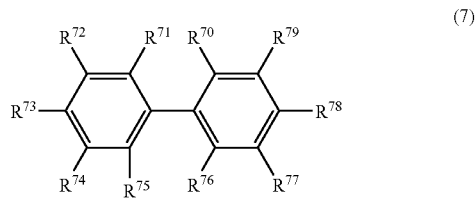

(7)

wherein $R^{70}$ to $R^{79}$ each represent a hydrogen atom, an alkyl group, an aryl group, or a group that forms a hydrocarbon ring when bonded to each other.

13. The organic electroluminescent device of claim 1, wherein at least one of the electron injection/transport compounds contained in the luminescent layer is a nitrogen-containing six-membered ring compound.

14. The organic electroluminescent device of claim 13, wherein the nitrogen-containing six-membered ring compound is represented by the following formula (8), formula (9), formula (10) or general formula (11)

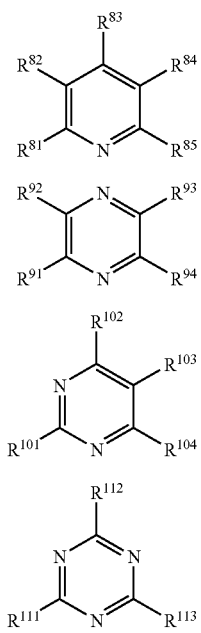

wherein $R^{81}$ to $R^{85}$, $R^{91}$ to $R^{94}$, $R^{101}$ to $R^{104}$ and $R^{111}$ to $R^{113}$ each represents a hydrogen atom or a substituent.

15. The organic electroluminescent device of claim 1, wherein at least one of the electron injection/transport compounds contained in the luminescent layer is a nitrogen-containing heterocyclic compound, and that at least one of the hole injection/transport compounds is a pyrrole compound.

16. The organic electroluminescent device of claim 1, wherein at least one of the electron injection/transport compounds contained in the luminescent layer is a nitrogen-containing heterocyclic compound, and that at least one of the hole injection/transport compounds is a triarylamine-based compound.

17. The organic electroluminescent device of claim 1, wherein at least one of the electron injection/transport compounds contained in the luminescent layer is a nitrogen-containing heterocyclic compound, and that at least one of the hole injection/transport compounds is a hydrocarbon-based aromatic compound.

18. The organic electroluminescent device of claim 1, wherein at least one of the electron injection/transport compounds contained in the luminescent layer is a hydrocarbon-based aromatic compound, and that at least one of the hole injection/transport compounds is a triarylamine-based compound.

19. The organic electroluminescent device of claim 1, wherein at least one of the electron injection/transport compounds contained in the luminescent layer is a hydrocarbon-based aromatic compound, and that at least one of the hole injection/transport compounds is a pyrrole compound.

20. The organic electroluminescent device of claim 1, wherein the luminescent layer has at least one stacked layer structure of an electron injection/transport compound and a hole injection/transport compound.

21. The organic electroluminescent device of claim 1, wherein a light emission caused by the organic electroluminescent device originates from the green or blue phosphorescent compound.

22. The organic electroluminescent device of claim 1, wherein the electron injection/transport compound has an electron affinity of from 2.5 eV to 3.3 eV.

23. The organic electroluminescent device of claim 1, wherein the hole injection/transport compound has an ionization potential of from 5.8 eV to 6.0 eV.

24. The organic electroluminescent device of claim 1, wherein the phosphorescent compound is an iridium complex or a platinum complex.

25. The organic electroluminescent device of claim 1, wherein the phosphorescent compound is an orthocarbometalated iridium complex.

26. The organic electroluminescent device of claim 1, wherein the phosphorescent compound is an orthocarbometalated iridium complex having a difluorophenylpyridine ligand.

* * * * *